(12) United States Patent
Kawakami et al.

(10) Patent No.: US 6,346,722 B1
(45) Date of Patent: Feb. 12, 2002

(54) SOLID STATE IMAGING DEVICE AND METHOD FOR MANUFACTURING THE SAME

(75) Inventors: Yukiya Kawakami; Akihito Tanabe; Nobuhiko Mutoh, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/340,127

(22) Filed: Jun. 28, 1999

(30) Foreign Application Priority Data

Jun. 26, 1998 (JP) .......................................... 10-180704
Nov. 30, 1998 (JP) .......................................... 10-340758

(51) Int. Cl.$^7$ .......................................... H01L 27/148
(52) U.S. Cl. .......................................... 257/215; 257/222
(58) Field of Search ............................... 257/215, 222, 257/228

(56) References Cited

U.S. PATENT DOCUMENTS

| 5,288,656 A | * | 2/1994 | Kusaka et al. ............... 437/53 |
| 5,313,081 A | * | 5/1994 | Yamada ...................... 257/232 |
| 5,514,887 A | * | 5/1996 | Hokari ....................... 257/222 |
| 5,619,049 A | * | 4/1997 | Kim .......................... 257/223 |
| 5,668,390 A | * | 9/1997 | Morimoto .................... 257/232 |
| 5,831,298 A | * | 11/1998 | Kawamoto et al. ......... 257/223 |

FOREIGN PATENT DOCUMENTS

| JP | 6318665 | 1/1988 |
| JP | 2105463 | 4/1990 |
| JP | 6120476 | 4/1994 |

* cited by examiner

Primary Examiner—Mark V. Prenty
(74) Attorney, Agent, or Firm—Young & Thompson

(57) ABSTRACT

A charge storing layer of a photodiode having an N-type conductivity includes an N$^+$-type additional implant area in the vicinity of a junction between the charge storing layer and an isolation region. The additional implant area provides an increase of stored charge and suppression of increase of the pulse voltage for a substrate shutter, and can be made to have a smaller width within a current design rule.

10 Claims, 33 Drawing Sheets

FIG. 17A
FIG. 17B
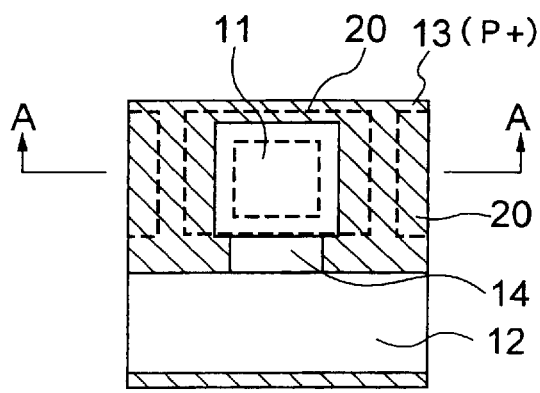
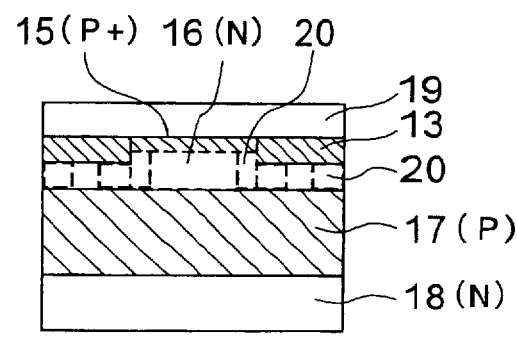
FIG. 18A
FIG. 18B
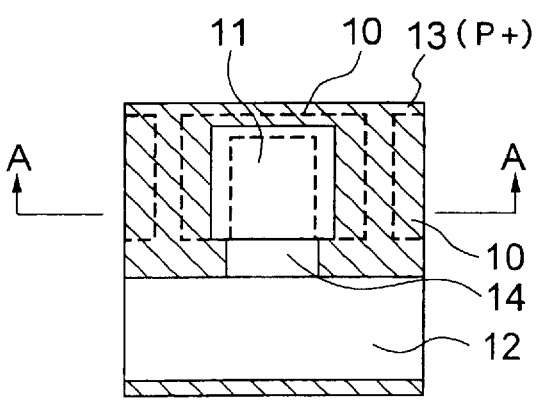
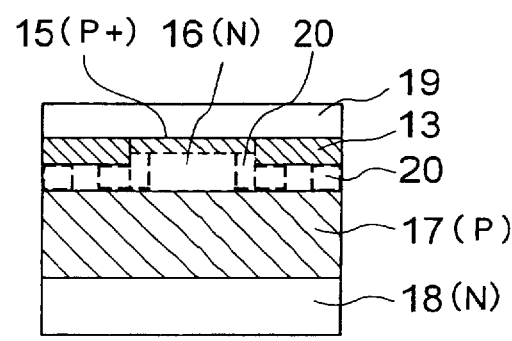

FIG. 31A
FIG. 31B
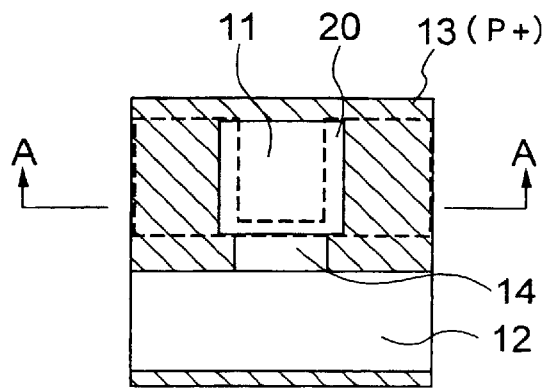
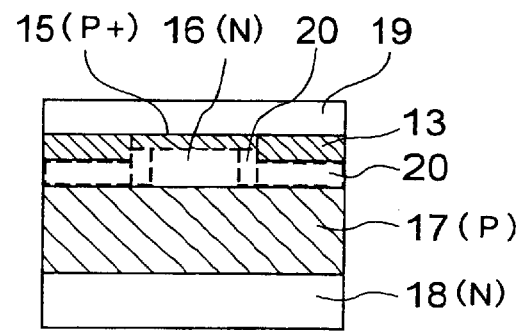
FIG. 32A
FIG. 32B
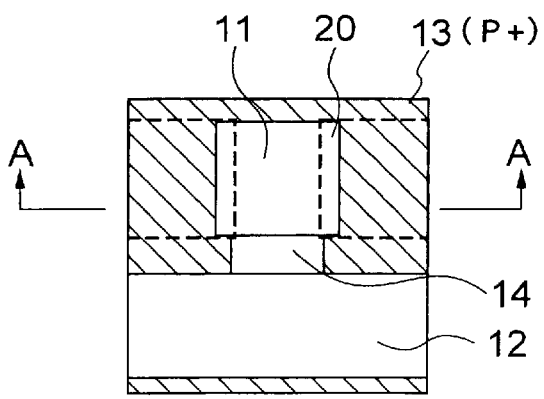
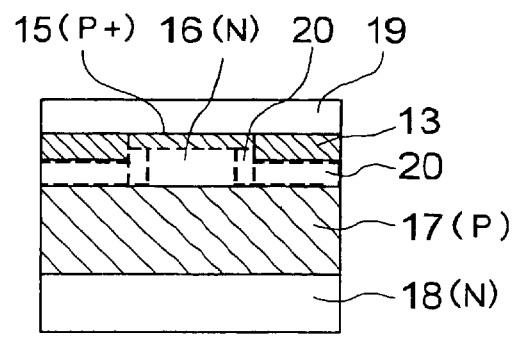

SOLID STATE IMAGING DEVICE AND METHOD FOR MANUFACTURING THE SAME

BACKGROUND OF THE INVENTION (a) Field of the Invention

The present invention relates to a solid state imaging device and a method for manufacturing the same.

(b) Description of the Related Art

Solid state imaging devices such as an interline CCD image sensor have a structure shown in FIGS. 1A and 1B, wherein FIG. 1A is a top plan view of the imaging device and FIG. 1B is a sectional view taken along line A—A in FIG. 1A. A plurality of photodiodes 11 are arranged in a matrix on an N-type silicon substrate 18, and a vertical CCD 12 is provided for each column of the photodiodes 11 for reading signal charge from each photodiode 11 through a charge transfer channel 14 and transferring the same to a horizontal CCD not shown. Each of the photodiodes 11 is separated from adjacent photodiodes by a P$^+$-type isolation region 13. If the imaging device is not of a CCD type, the CCD 12 in FIG. 1A is replaced by drain regions of MOS-FETs.

In operation of the solid state imaging device as described above, signal light incident onto the photodiode 11 is converted to signal charge by a photoelectric conversion, accumulated for a specified interval, then read out from the photodiode 11 to the vertical CCD 12 by applying a transfer voltage to a transfer gate provided above the charge transfer channel 14.

After the signal charge is transferred from the photodiode 11, the N-type substrate 18 is applied with a high voltage pulse for withdrawing electrons from the photodiodes 11, thereby effecting a "substrate shutter". The substrate shutter provides control of amount of the stored charge in the photodiode 11.

In general, it is preferable that the photodiode have a higher photo-sensitivity and a larger capacity for storing the signal charge. In addition, there is an increasing demand for reduction of each pixel area or photoelectric conversion area to decrease the total area and the cost of the solid state imaging device as well as to increase the number of pixels per unit area. The reduction of the pixel area is generally implemented by reduction of the area occupied by the photodiode 11.

Reduction of the area occupied by the photodiode involves several problems. First, a three-dimensional effect occurs wherein the influence by the isolation region increases, resulting in that the depth of the photodiode cannot be evaluated in a single dimension. This in turn results in reduction of the stored charge compared to the expected stored charge which is calculated from the ratio (area ratio) of the photodiode area to the total area.

Second, since the photodiodes are subjected to depletion during the substrate shutter by depleting the isolation region, the area of which is relatively increased by reduction of the photodiode area, the pulse voltage necessary for the substrate shutter is increased. In this case, if the stored charge is to be increased by raising the impurity concentration of the charge storing area of the photodiode, the higher pulse voltage for the substrate shutter may exceed the power supply voltage of a portable device, or may increase power dissipation in the portable device. Thus, increase of the stored charge in the photodiodes is incompatible with the reduction of the pulse voltage for the substrate shutter.

SUMMARY OF THE INVENTION

In view of the above, it is an object of the present invention to provide a solid state imaging device capable of increasing stored charge in the photodiodes and suppressing the increase of the pulse voltage for the substrate shutter.

It is another object of the present invention to provide a method for fabricating the solid state imaging device as described above.

The present invention provides a solid state imaging device including a semiconductor substrate having a first conductivity type, a first layer having a second conductivity type opposite to the first conductivity type, a charge storing area formed on the first layer and having the first conductivity, a second layer formed on the charge storing layer and having the second conductivity type, the charge storing area and the second layer forming a photodiode, a charge transfer channel formed adjacent to the charge storing area, an isolation region having the second conductivity, the charge storing area being surrounded by the isolation region except for a side adjacent to the charge transfer channel, and an additional implant area subjected to implantation of impurity ions and disposed in a peripheral region of the charge storing area.

The present invention also provides a method for forming a solid state imaging device including a semiconductor substrate having a first conductivity type, a first layer having a second conductivity type opposite to the first conductivity type, a charge storing area formed on the first layer and having the first conductivity, a second layer formed on the charge storing layer and having the second conductivity type, the charge storing area and the second layer forming a photodiode, a charge transfer channel formed adjacent to the charge storing area, an isolation region having the second conductivity, the charge storing area being surrounded by the isolation region except for a side adjacent to the charge transfer channel, the method comprising the step of forming an additional implant area by implanting additional impurity ions having the first conductivity type into at least one of a peripheral region of the charge storing area and the isolation region.

In accordance with the solid state imaging device of the present invention and fabricated by the method of the present invention, the charge stored in the charge storing area can be increased by the additional implant area substantially without increasing the pulse voltage for the substrate shutter.

The above and other objects, features and advantages of the present invention will be more apparent from the following description, referring to the accompanying drawings.

BRIEF DESCRIPTION OF THE DRAWINGS

FIGS. 17A and 17B are a top plan view and a sectional view taken along line A—A in FIG. 17A, respectively, of a solid state imaging device according to a sixteenth embodiment of the present invention.

FIGS. 18A and 18B are a top plan view and a sectional view taken along line A—A in FIG. 18A, respectively, of a solid state imaging device according to a seventeenth embodiment of the present invention.

FIGS. 31A and 31B are a top plan view and a sectional view taken along line A—A in FIG. 31A, respectively, of a solid state imaging device according to a 30th embodiment of the present invention.

FIGS. 32A and 32B are a top plan view and a sectional view taken along line A—A in FIG. 32A, respectively, of a solid state imaging device according to a 31st embodiment of the present invention.

FIGS. 38A to 43A are sectional views showing consecutive steps in a process for fabricating the solid state imaging device of the fourth embodiment of the present invention.

FIGS. 38B to 43B are top plan views of the consecutive steps of FIGS. 38A to 43A, respectively.

FIGS. 44A to 49A are sectional views showing consecutive steps in a process for fabricating the solid state imaging device of the fourth embodiment of the present invention.

FIGS. 44B to 49B are top plan views of the consecutive steps of FIGS. 44A to 49A, respectively.

FIGS. 50A to 55A are sectional views showing consecutive steps in a process for fabricating the solid state imaging device of the fifth embodiment of the present invention.

FIGS. 50B to 55B are top plan views of the consecutive steps of FIGS. 50A to 55A, respectively.

PREFERRED EMBODIMENTS OF THE INVENTION

Figure 1A:
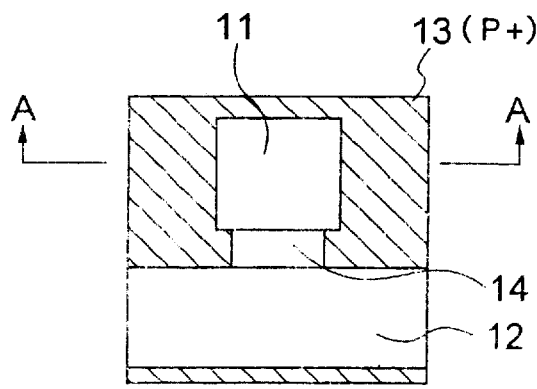
FIGS. 1A and 1B are a top plan view and a sectional view taken along line A—A in FIG. 1A, respectively, of a conventional solid state imaging device.

Before describing the preferred embodiments of the present invention, the principle of the present invention will be described. In general, the reason why the actual stored charge is lower compared to the evaluated stored charge expected from the area ratio of the photodiode having a reduced occupied area to the total area is that the charge storing area of the photodiode has inevitably a lower impurity concentration in the peripheral region of the charge storing area compared to the impurity concentration in the central region of the charge storing area. Thus, it is preferable that the peripheral region of the charge storing area be designed to have a higher impurity concentration compared to the central region thereof. This can be achieved by forming the peripheral region as an additional implant area which is subjected to an additional impurity implantation. The additional implant area may be provided as an area adjacent to the interface or junction between the charge storing area and the isolation region.

On the other hand, the reason why the pulse voltage for the substrate shutter is increased is that lines of electric force from the substrate during the substrate shutter extends toward the isolation region, as well as toward the photodiode for effective depletion of the charge storing area of the photodiode. In view of this, in order to reduce the lines of electric force extending toward the isolation region, the influence by the isolation region should be suppressed. In a more concrete structure, impurity ions having an opposite conductivity may be injected to a region below the isolation region. Thus, the increase of the pulse voltage for the substrate shutter can be suppressed by providing, below the isolation region, a region subjected to an additional implantation of impurities having the conductivity same as the conductivity of the charge storing area. The additional implantation may be effected from the interface between the charge storing area and the isolation region toward the isolation region.

In view of the above, the region provided in the vicinity of the photodiode and subjected to additional ion implantation of impurity ions having a conductivity same as the conductivity of the charge storing area can provide both the structure for increasing the stored charge and the structure for reducing the pulse voltage for the substrate shutter. Thus, in an embodiment of the present invention, separate mask patterns are prepared for an additional ion implantation for increasing the stored charge and for an additional ion implantation for suppressing the pulse voltage for the substrate shutter. Alternatively, a single mask pattern may be provided for a single additional ion implantation both for increasing the stored charge and for suppressing the pulse voltage of the substrate shutter.

Now, the present invention is more specifically described with reference to accompanying drawings, wherein similar constituent elements are designated by similar reference numerals.

Figure 2A:
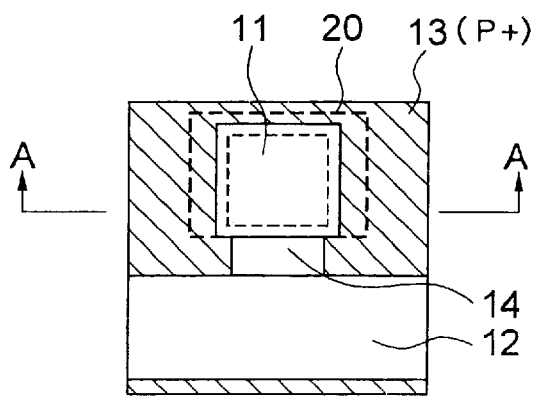
FIGS. 2A and 2B are a top plan view and a sectional view taken along line A—A in FIG. 2A, respectively, of a solid state imaging device according to a first embodiment of the present invention.
Figure 2B:
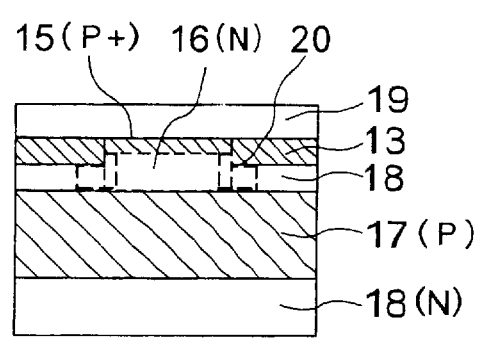

Referring to FIGS. 2A and 2B, a solid state imaging device according to a first embodiment, or one of the first aspect of the present invention, includes an N-type substrate 18, a first layer implemented by P-type layer 17 formed on the N-type substrate 18, a plurality of photodiodes 11 disposed in a matrix on the P-type layer 17, a P$^+$-type isolation region 13 formed on the N-type substrate 18 for isolating each of the photodiodes 11 from another of the photodiodes 11, a vertical CCD disposed for each column of the photodiodes 11 for reading out electric charge from the photodiodes 11 through respective charge transfer channel 14.

Each photodiode 11 is formed by P$^+$-type layer 15, N-type layer 16 formed as a charge storing area (or photoelectric conversion area), P-type layer 17 and N-type substrate 18. Each photodiode 11 is associated with an additional implant area 20, which is disposed both in the outer periphery of the photodiode 11 and in the inner periphery of the isolation region 13. In the drawings, a conductive layer implementing the gate electrode and an overlying passivation layer are omitted for illustration for a simplification purpose. The photodiode 11 is surrounded, as viewed in the vertical direction, by the isolation region 13 except for the side adjacent to the charge transfer channel 14 and covered by the insulator film 19 at the top of the photodiode 11.

The additional implant area 20 subjected to implantation of N-type impurity ions includes the edge portion of the charge storing area implemented by the N-type layer 16 at one of the sides of the charge storing area in contact with the charge transfer channel 14, and includes, at three of the sides of the charge storing area, the junction area between the charge storing area and the isolation region 13. By these configurations, the solid state imaging device of the present embodiment stores a larger amount of electric charge and suppresses the increase of the pulse voltage for the substrate shutter.

Figure 3A:
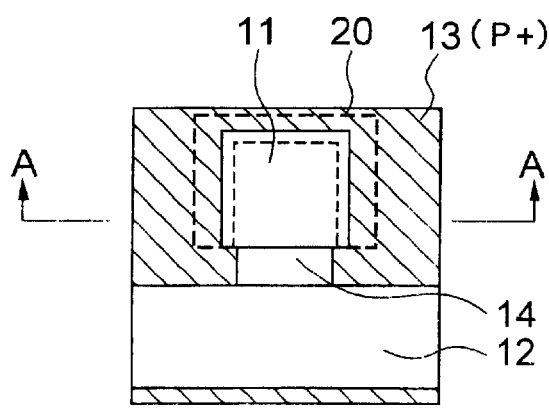
FIGS. 3A and 3B are a top plan view and a sectional view taken along line A—A in FIG. 3A, respectively, of a solid state imaging device according to a second embodiment of the present invention.
Figure 3B:
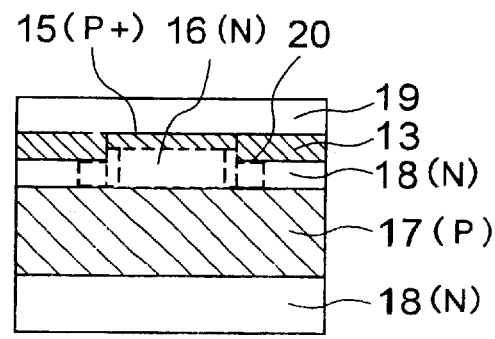

Referring to FIGS. 3A and 3B, a solid state imaging device according to a second embodiment of the present invention is similar to the first embodiment except for the configuration of the additional implant area 20, which does not include the edge portion of the charge storing area in contact with the charge transfer channel 14. This configuration of the second embodiment prevents a punch-through phenomenon wherein the electric charge stored in the photodiode 11 is transferred by overflow through the charge transfer channel 14 to the CCD 12 during a charge storing period, in addition to provision of the increase of the stored charge and suppression of the increase of the pulse voltage for the substrate shutter.

Figure 4A:
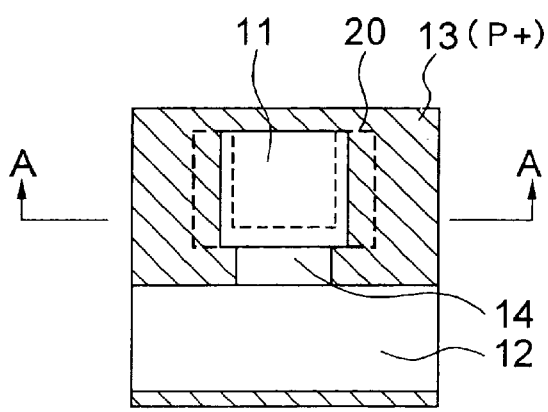
FIGS. 4A and 4B are a top plan view and a sectional view taken along line A—A in FIG. 4A, respectively, of a solid state imaging device according to a third embodiment of the present invention.
Figure 4B:
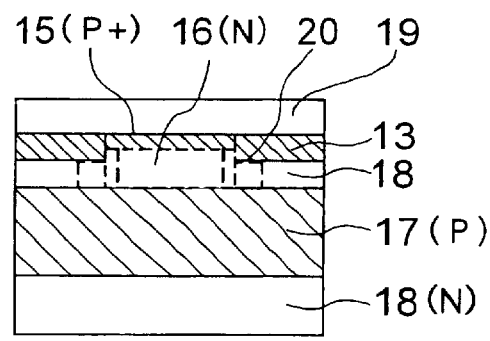

Referring to FIGS. 4A and 4B, a solid state imaging device according to a third embodiment of the present invention is similar to the first embodiment except for the configuration of the additional implant area 20, which does not include a portion of the junction area between the charge storing area implemented by the N-type layer 16 and the isolation region 13, the portion being opposite to the charge transfer channel 14 with the charge storing area disposed therebetween. This configuration of the present embodiment allows the deepest potential portion of the charge storing area to deviate toward the charge transfer channel 14, thereby reducing the necessary gate voltage for the charge transfer channel 14 to thereby increase the stored charge and suppress the pulse voltage for the substrate shutter.

Figure 5A:
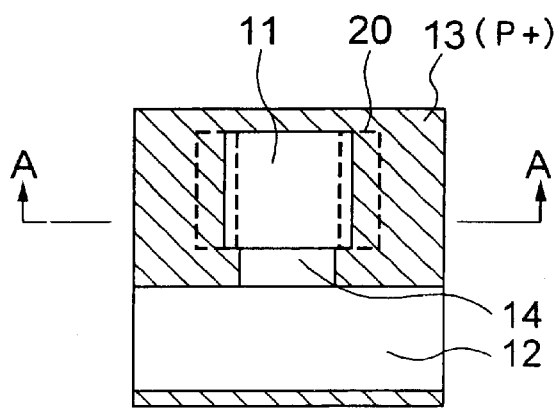
FIGS. 5A and 5B are a top plan view and a sectional view taken along line A—A in FIG. 5A, respectively, of a solid state imaging device according to a fourth embodiment of the present invention.
Figure 5B:
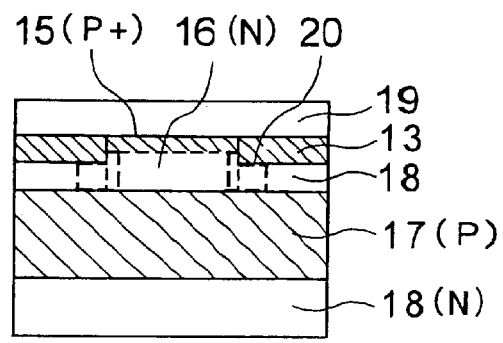

Referring to FIGS. 5A and 5B, a solid state imaging device according to a fourth embodiment of the present invention is similar to the first embodiment except for the configuration of the additional implant area, which does not include the side of the charge storing area in contact with the charge transfer channel 14 and a portion of the junction area between the charge storing area implemented by the N-type layer 16 and the isolation region 13 at the side opposite to the charge transfer channel 14 with the charge storing area disposed therebetween. This configuration of the present embodiment prevents a punch-through phenomenon wherein the electric charge stored in the photodiode 11 is transferred by overflow through the isolation region 13 to the CCD 12, thereby increasing the stored charge and suppressing the pulse voltage for the substrate shutter.

Figure 35:
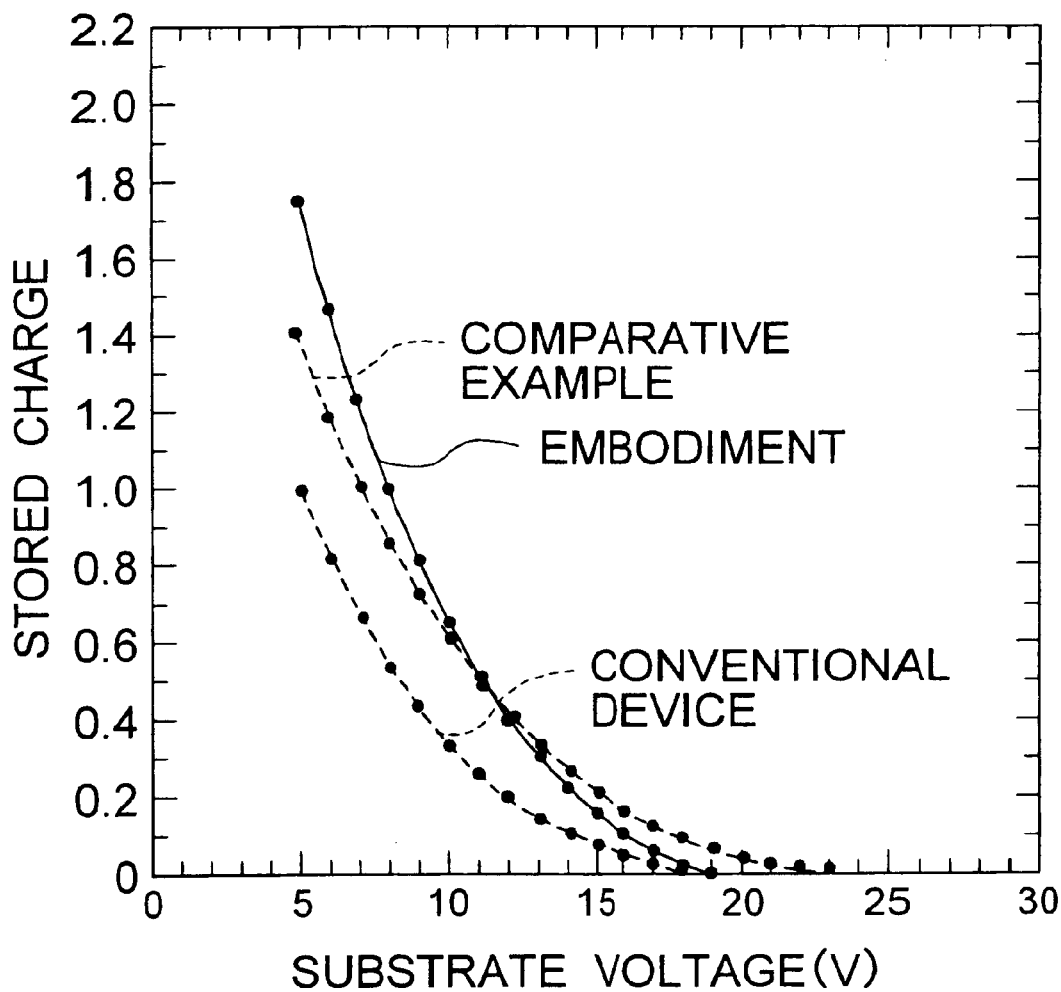
FIG. 35 is a graph showing result of simulation for comparing the fourth embodiment and the conventional device.

FIG. 35 shows results of simulation for the conventional solid state imaging device, a comparative example, and the fourth embodiment, wherein stored charge is plotted against the substrate voltage, with the conditions for the implantation of the impurity ions into the additional implant area 20 in the fourth embodiment being similar to the conditions for implantation for the N-type layer 16.

The maximum electric charge obtained in the present embodiment is 1.8 times of the maximum electric charge obtained in the conventional device. As shown in the drawing, the present embodiment exhibited the increase of stored charge compared to the conventional device and exhibited reduction of the pulse voltage for the substrate shutter compared to the comparative example wherein the dosage of the implantation of the impurity ions in the conventional device is increased by 10%. The pulse voltage measured in the present embodiment for the condition where the stored electric charge becomes zero is equivalent to the conventional case, whereas the comparative example exhibited a significant increase of the pulse voltage for the substrate shutter.

In the present invention, the conditions for the additional implantation need not be necessarily similar to the conditions for the implantation for the N-type layer 16. Only a small increase of the acceleration energy in the implantation for the additional implant area is sufficient to decrease the pulse voltage for the substrate shutter. On the other hand, a small decrease of the acceleration energy in the additional implantation increases the stored charge. If the dosage of the impurity ions is increased, it results in the increase of the stored charge. However, if the dosage is increased above a threshold, the electric charge cannot be read out from the photodiode at a reasonable read voltage. In general, the acceleration energy and the dosage of the ion implantation are design parameters wherein the acceleration energy is usually changed from 50% to 150% and the dosage is usually changed from 10% to 300% of the acceleration energy or the dosage for the N-type layer 16.

Figure 6A:
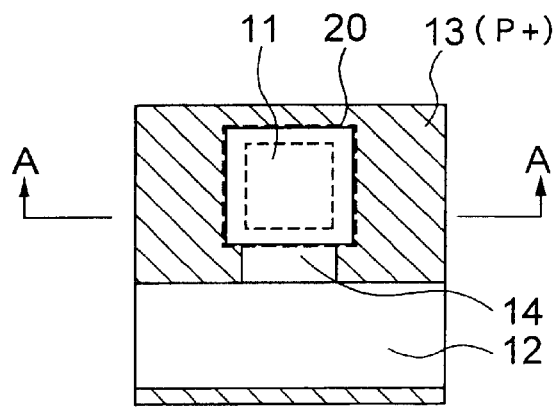
FIGS. 6A and 6B are a top plan view and a sectional view taken along line A—A in FIG. 6A, respectively, of a solid state imaging device according to a fifth embodiment of the present invention.
Figure 6B:
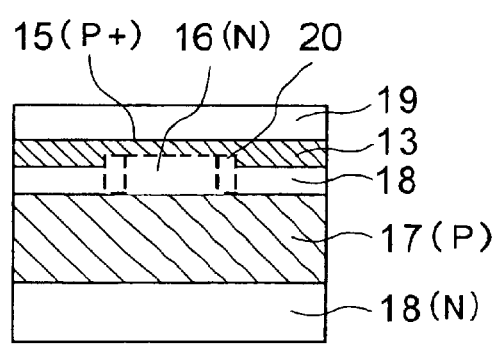

Referring to FIGS. 6A and 6B, a solid state imaging device according to a fifth embodiment, or one of the second aspect of the present invention, is similar to the first embodiment except for the configuration of the additional implant area 20, which is disposed within the peripheral area of the N-type layer 16 in the photodiode 11 in the present embodiment. This configuration provides a further increase of the stored charge.

Figure 7A:
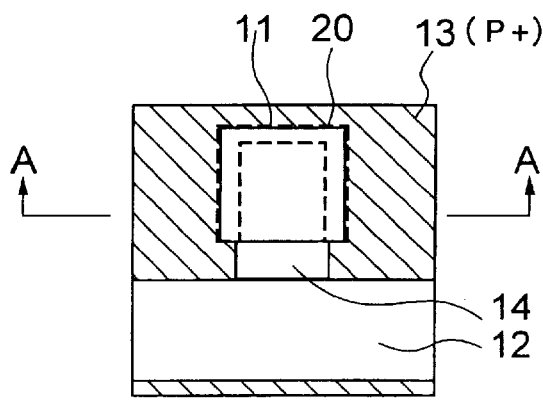
FIGS. 7A and 7B are a top plan view and a sectional view taken along line A—A in FIG. 7A, respectively, of a solid state imaging device according to a sixth embodiment of the present invention.
Figure 7B:
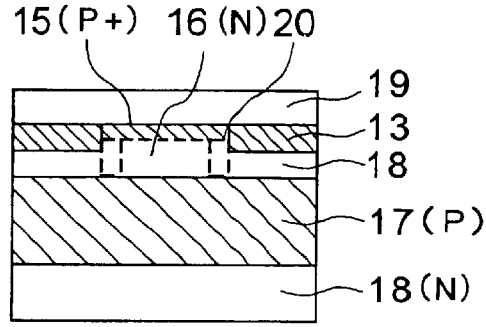

Referring to FIGS. 7A and 7B, a solid state imaging device according to a sixth embodiment of the present invention is similar to the fifth embodiment except for the configuration of the additional implant area 20, which has not a portion disposed at the side of the charge storing area in contact with the charge transfer channel 14 in the present embodiment. This configuration of the present embodiment prevents a punch-through phenomenon wherein the electric charge stored in the photodiode is transferred by overflow through the charge transfer channel 14 to the adjacent CCD 12, in addition to provision of the increase of the stored charge.

Figure 8A:
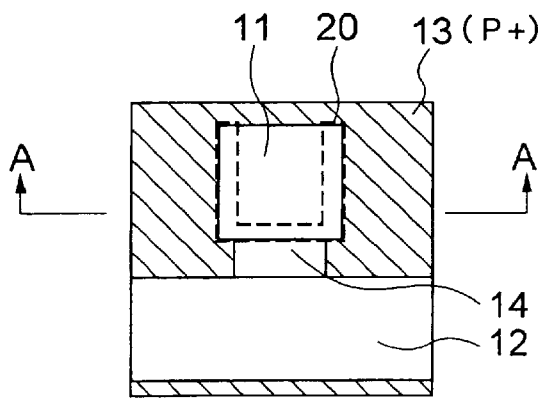
FIGS. 8A and 8B are a top plan view and a sectional view taken along line A—A in FIG. 8A, respectively, of a solid state imaging device according to a seventh embodiment of the present invention.
Figure 8B:
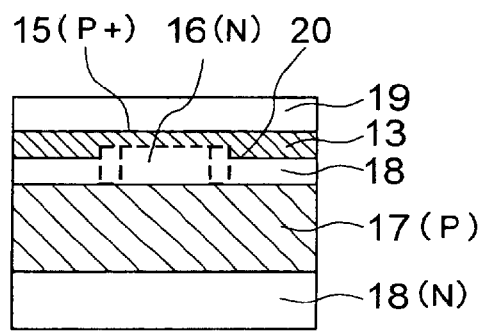

Referring to FIGS. 8A and 8B, a solid state imaging device according to a seventh embodiment of the present invention is similar to the fifth embodiment except for the configuration of the additional implant area 20, which has not a portion at the side of the charge storing area opposing to the charge transfer channel 14 with the charge storing area disposed therebetween. This configuration allows the deepest potential portion of the charge storing area to deviate toward the charge transfer channel 14, thereby decreasing the gate voltage for read-out of the electric charge and increasing the stored charge.

Figure 9A:
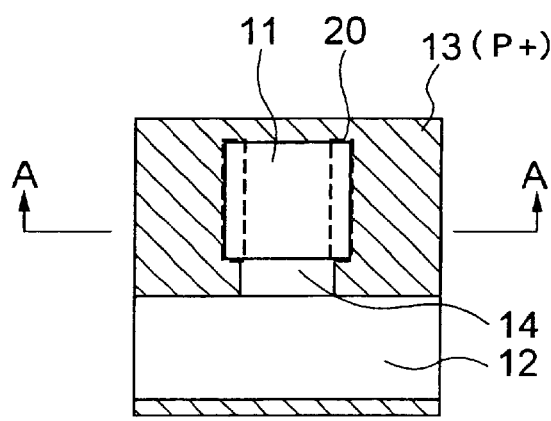
FIGS. 9A and 9B are a top plan view and a sectional view taken along line A—A in FIG. 9A, respectively, of a solid state imaging device according to an eighth embodiment of the present invention.
Figure 9B:
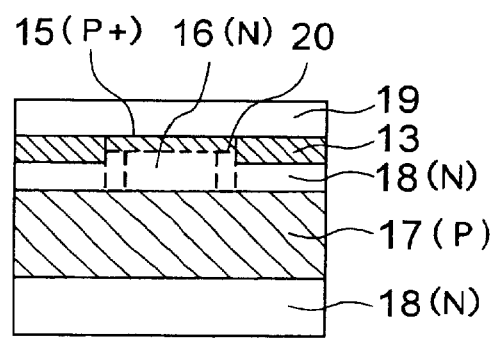

Referring to FIGS. 9A and 9B according to an eighth embodiment of the present invention is similar to the fifth embodiment except for the configuration of the additional implant area 20, which has not a portion in the vicinity of the charge transfer channel 14 and in the vicinity of the junction between the charge storing area implemented by the N-type layer 16 and the isolation region 13 at the side of the charge storing area opposing the charge transfer channel 14 with the charge storing area disposed therebetween. This configuration of the present embodiment prevents a punch-through phenomenon wherein the electric charge stored in the photodiode is transferred by overflow through the isolation region 13 to the CCD 12 and increasing the stored charge.

Figure 10A:
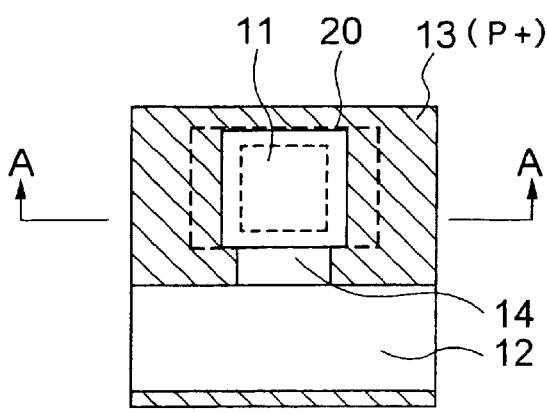
FIGS. 10A and 10B are a top plan view and a sectional view taken along line A—A in FIG. 10A, respectively, of a solid state imaging device according to a ninth embodiment of the present invention.
Figure 10B:
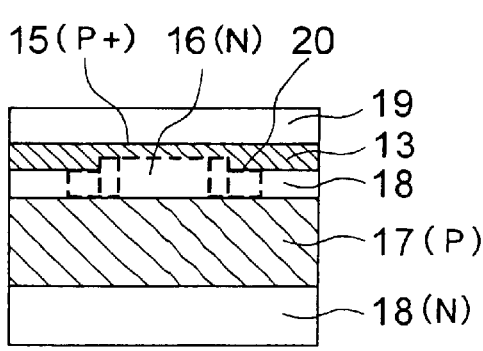

Referring to FIGS. 10A and 10B, a solid state imaging device according to a ninth embodiment, one of the third aspect of the present invention, is similar to the first embodiment except for the configuration of the additional implant area 20, which is disposed only in the charge storing area in the vicinity of the side of the junction between the charge storing area implemented by the N-type layer 16 and the isolation region 13, the side opposing the charge transfer channel 14 with the charge storing area disposed therebetween. This configuration of the present embodiment prevents a punch-through phenomenon wherein the electric charge stored in the photodiode is transferred by overflow through the isolation region 13 to the CCD 12, increasing the stored charge and suppressing the pulse voltage for the substrate shutter.

Figure 11A:
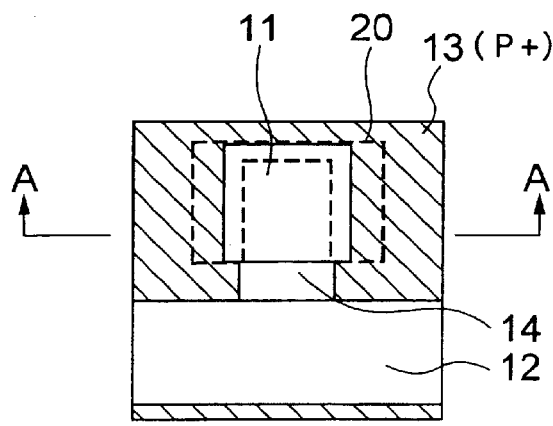
FIGS. 11A and 11B are a top plan view and a sectional view taken along line A—A in FIG. 11A, respectively, of a solid state imaging device according to a tenth embodiment of the present invention.
Figure 11B:
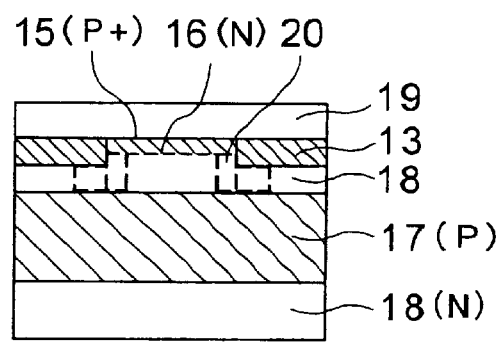

Referring to FIGS. 11A and 11B, a solid state imaging device according to a tenth embodiment of the present invention is similar to the ninth embodiment except for the configuration of the additional implant area 20, which has not a portion in the vicinity of the charge transfer channel 14 in the present embodiment. This configuration of the present embodiment prevents a punch-through phenomenon wherein the electric charge stored in the photodiode is transferred by overflow through the isolation region 13 to the CCD 12, thereby increasing the stored charge and suppressing the pulse voltage for the substrate shutter.

Figure 12A:
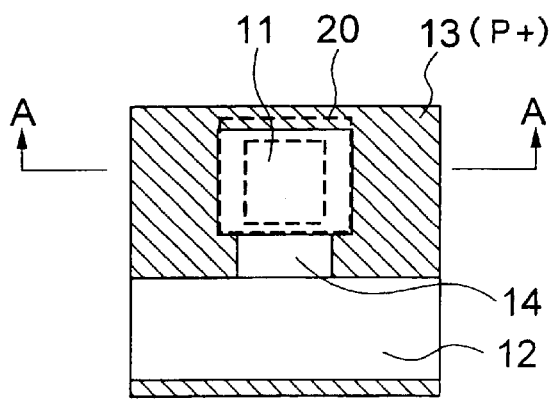
FIGS. 12A and 12B are a top plan view and a sectional view taken along line A—A in FIG. 12A, respectively, of a solid state imaging device according to a eleventh embodiment of the present invention.
Figure 12B:
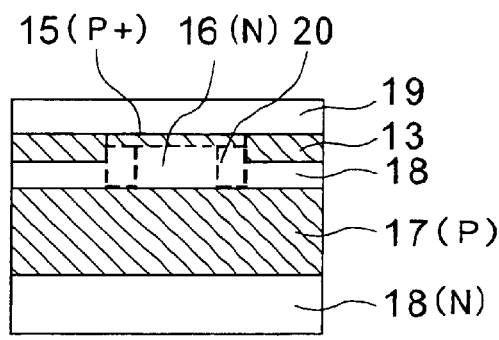

Referring to FIGS. 12A and 12B, a solid state imaging device according to an eleventh embodiment, one of the fourth aspect of the present invention, is similar to the fifth embodiment except for the configuration of the additional implant area 20, which extends toward and within the isolation region 13 at the side of the junction between the charge storing area implemented by the N-type layer 16 and the isolation region 13, the side opposing the charge transfer channel 14 with the charge storing area disposed therebetween. This configuration of the present embodiment prevents smear charge from entering the CCD 12 from the photodiode 11 through the isolation region 13, and increases the stored charge.

Figures 13A, 13B:
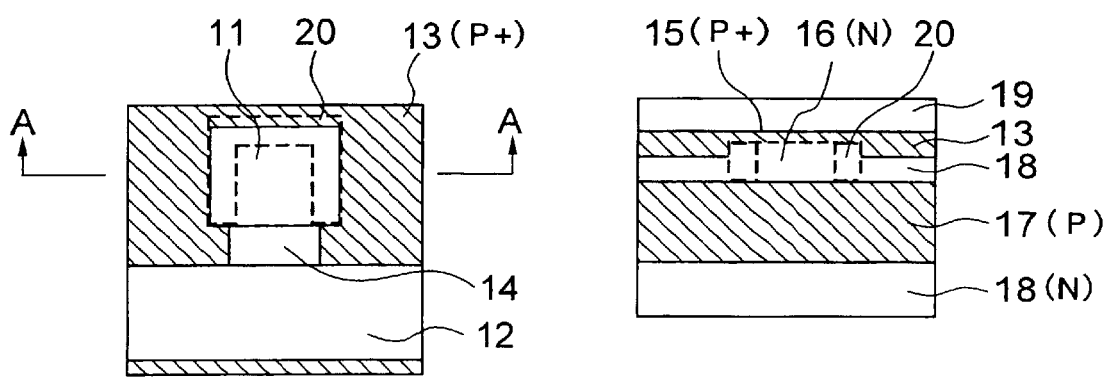
FIGS. 13A and 13B are a top plan view and a sectional view taken along line A—A in FIG. 13A, respectively, of a solid state imaging device according to a twelfth embodiment of the present invention.

Referring to FIGS. 13A and 13B, a solid state imaging device according to a twelfth embodiment of the present invention is similar to the eleventh embodiment except for the configuration of the additional implant area 20, which has not a portion in the vicinity of the side of the charge storing area in contact with the charge transfer channel 14. This configuration of the present embodiment prevents smear charge from entering the CCD 12 from the photodiode 11 through the isolation region 13, prevents a punch-through phenomenon wherein the electric charge stored in the photodiode is transferred by overflow through the charge transfer channel 14 to the CCD 12, and increases the stored charge.

Figures 14A, 14B:
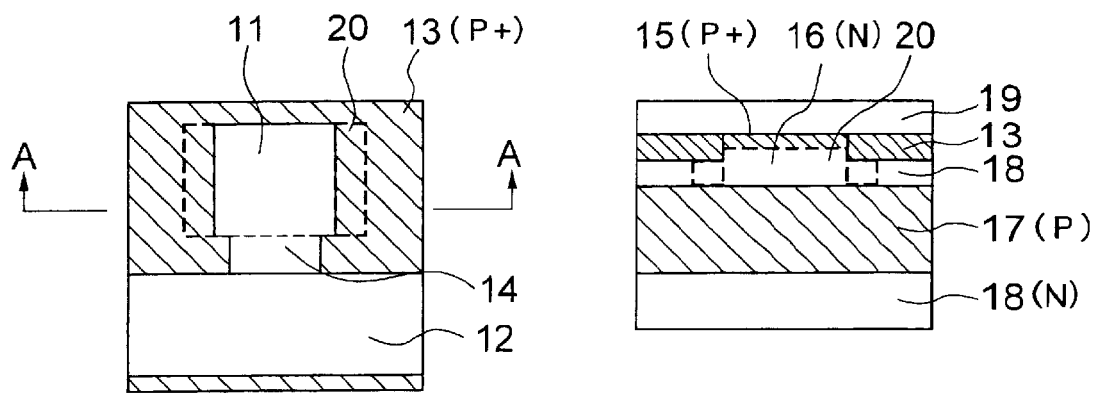
FIGS. 14A and 14B are a top plan view and a sectional view taken along line A—A in FIG. 14A, respectively, of a solid state imaging device according to a thirteenth embodiment of the present invention.

Referring to FIGS. 14A and 14B, a solid state imaging device according to a thirteenth embodiment, one of the fifth aspect of the present invention, is similar to the fourth embodiment except for the configuration of the additional implant area 20, which extends toward and within the isolation region 13 at the sides of the junction between the photodiode 11 and the isolation region 13 other than the side near the charge transfer channel 14 and the side opposite to the charge transfer channel 14 with the charge storing area disposed therebetween. This configuration of the present embodiment suppresses the increase of the pulse voltage for the substrate shutter.

Figure 15A:
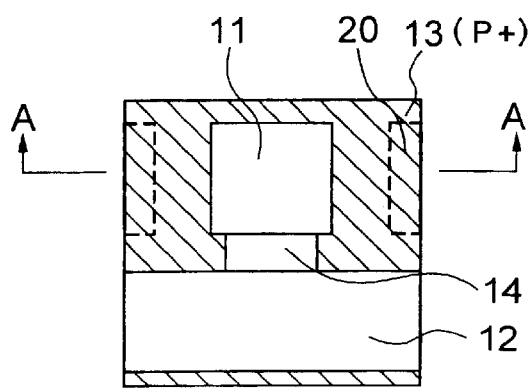
FIGS. 15A and 15B are a top plan view and a sectional view taken along line A—A in FIG. 15A, respectively, of a solid state imaging device according to a fourteenth embodiment of the present invention.
Figure 15B:
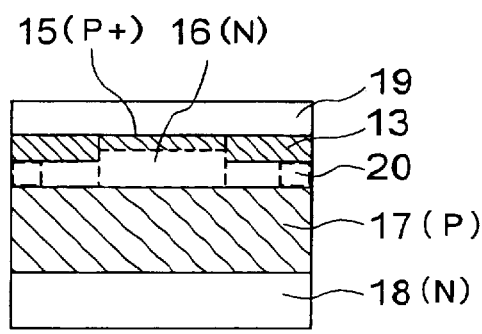

Referring to FIGS. 15A and 15B, a solid state imaging device according to a fourteenth embodiment of the present invention is similar to the thirteenth embodiment except for the configuration of the additional implant area 20, which resides only in a central area of the element isolating region 13 disposed between two adjacent photodiodes 11. This configuration of the present embodiment enables stable characteristics of the solid state imaging device even in the case of misalignment between mask patterns, the stable characteristics including the stable suppression of the pulse voltage for the substrate shutter.

Figure 16A:
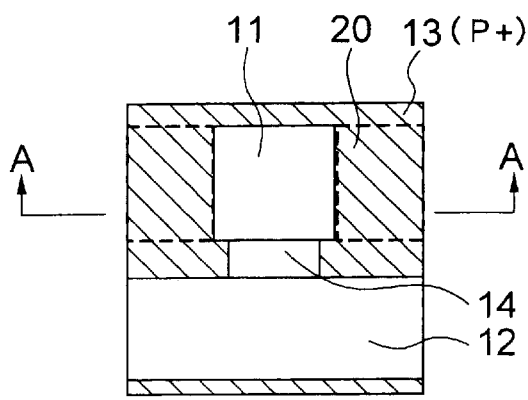
FIGS. 16A and 16B are a top plan view and a sectional view taken along line A—A in FIG. 16A, respectively, of a solid state imaging device according to a fifteenth embodiment of the present invention.
Figure 16B:
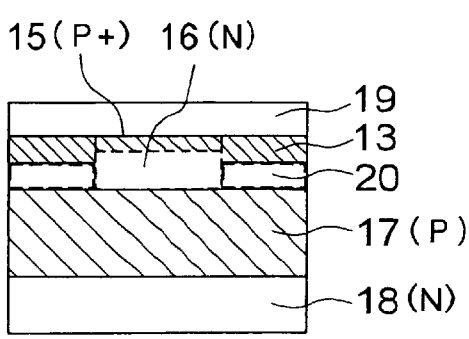

Referring to FIGS. 16A and 16B, a solid state imaging device according to a fifteenth embodiment of the present invention is similar to the thirteenth embodiment except for the configuration of the additional implant area 20, which extends within all over the isolation region 13 between two adjacent photodiodes, underlying the isolation region 13.

This configuration of the present embodiment enables a larger minimum size for the mask pattern, which is suitable for reduction of dimensions, and reduction of the pulse voltage for the substrate shutter.

Figure 36:
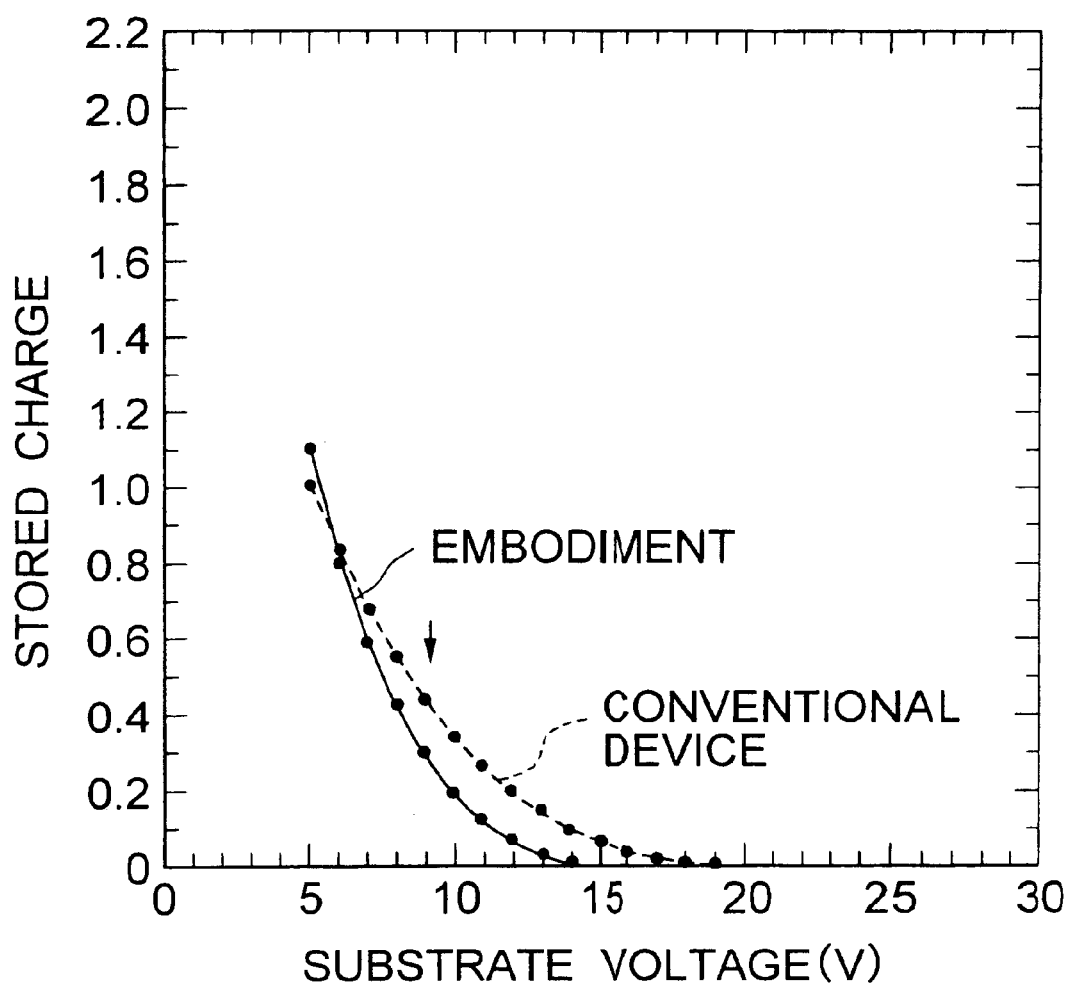
FIG. 36 is a graph showing result of simulation for comparing the fifteenth embodiment and the conventional device.

FIG. 36 shows, similarly to FIG. 35, results of simulation for the fifteenth embodiment and the conventional solid state imaging device, wherein conditions for impurity implantation into the additional implant area 20 are similar to those in the N-type layer 16. As understood from the drawing, the voltage to be applied to the substrate to obtain zero electric charge in the photodiode in the present embodiment is lower than that in the conventional device, which shows a reduction in the pulse voltage for the substrate shutter. In the present embodiment, the conditions for the impurity implantation into the additional implant area need not be equivalent to those for the N-type layer 16. A larger acceleration energy or a larger dosage may reduce the pulse voltage for the substrate shutter to some extent. The acceleration energy and the dosage of the additional implant area 20 may be changed as variable parameters from 50% to 150% and 10% to 300%, respectively, of the acceleration energy and the dosage of the N-type layer 16.

Next, sixth to tenth aspects of the present invention will be described with reference to the drawings. These devices are basically obtained by combination of one of the first to fourth aspects and the fifth aspect of the present invention and achieve both the advantages of the combined aspects.

Referring to FIGS. 17A and 17B, a solid state imaging device according to a sixteenth embodiment, one of the sixth aspect of the present invention, is obtained by combination of the configurations of the additional implant areas 20 in both the first embodiment and fourteenth embodiment. More specifically, the additional implant area 20 includes a first portion including the edge portion of the charge storing area at the side of the charge storing area in contact with the charge transfer channel 14 and the junction area between the charge storing area implemented by the N-type layer 16 and the isolation region 13, and a second portion disposed at the central area of the isolation region 13 between two adjacent photodiodes 11. This configuration increases the stored charge and suppresses the increase of the pulse voltage for the substrate shutter.

Referring to FIGS. 18A and 18B, a solid state imaging device according to a seventh embodiment of the present invention is obtained by combination of the configurations of the additional implant areas 20 in both the second embodiment and the fourteenth embodiment. This configuration of the present embodiment prevents a punch-through wherein the electric charge stored in the photodiodes 11 is transferred by overflow to the CCD 12 through the charge transfer channel 14, thereby increasing the stored charge and suppressing increase of the pulse voltage for the substrate shutter.

Figure 19A:
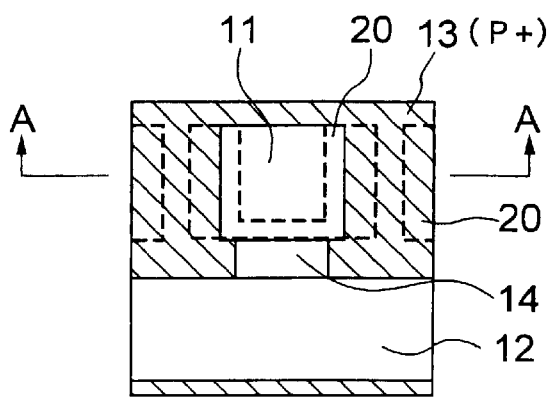
FIGS. 19A and 19B are a top plan view and a sectional view taken along line A—A in FIG. 19A, respectively, of a solid state imaging device according to a eighteenth embodiment of the present invention.
Figure 19B:
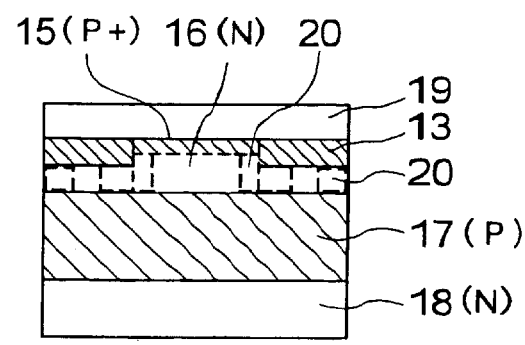

Referring to FIGS. 19A and 19B, a solid state imaging device according to an eighteenth embodiment of the present invention is obtained by combination of the configurations of the additional implant areas 20 in both the third embodiment and the fourteenth embodiment. This configuration of the present embodiment allows the deepest potential portion of the charge storing area to deviate toward the charge transfer channel 14, which decreases the gate voltage for read-out, in addition to provision of the increase of the stored charge and reduction of the pulse voltage for the substrate shutter.

Figure 20A:
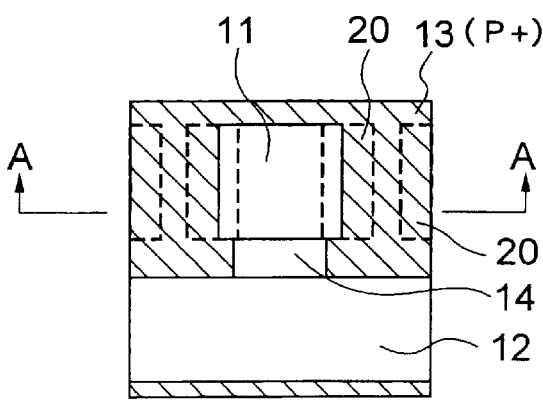
FIGS. 20A and 20B are a top plan view and a sectional view taken along line A—A in FIG. 20A, respectively, of a solid state imaging device according to a nineteenth embodiment of the present invention.
Figure 20B:
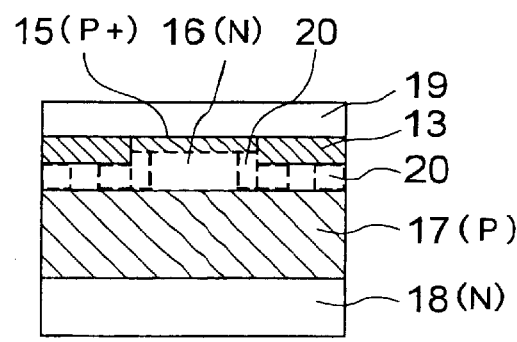

Referring to FIGS. 20A and 20B, a solid state imaging device according to a twentieth embodiment of the present invention is obtained by combination of the configurations of the additional implant area 20 in both the fourth embodiment and the fourteenth embodiment. This configuration of the present embodiment prevents a punch-through phenomenon, increases the stored charge and suppresses the increase of the pulse voltage for the substrate shutter.

Figure 21A:
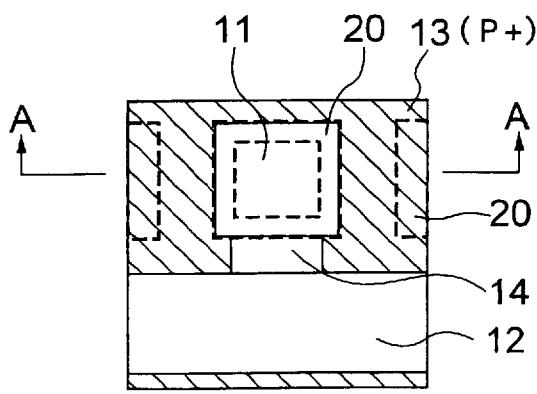
FIGS. 21A and 21B are a top plan view and a sectional view taken along line A—A in FIG. 21A, respectively, of a solid state imaging device according to a twentieth embodiment of the present invention.
Figure 21B:
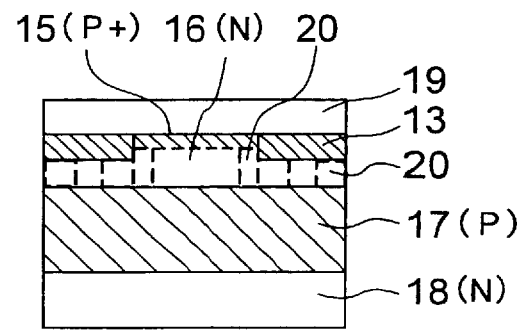

Referring to FIGS. 21A and 21B, a solid state imaging device according to a twentieth embodiment, one of the seventh aspect of the present invention, is obtained by combination of the configurations of the additional implant areas 20 in both the fifth embodiment and the fourteenth embodiment. This configuration of the present embodiment increases the stored charge and suppresses the increase of the pulse voltage for the substrate shutter.

Figure 22A:
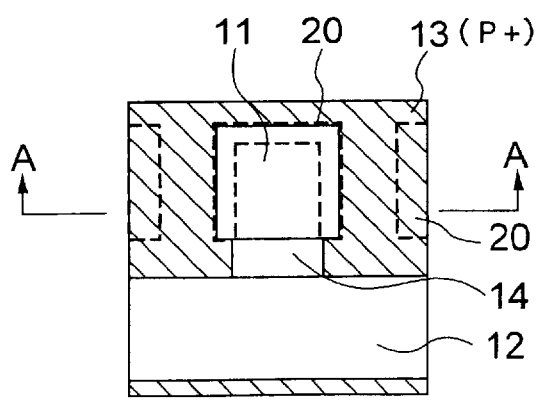
FIGS. 22A and 22B are a top plan view and a sectional view taken along line A—A in FIG. 22A, respectively, of a solid state imaging device according to a 21st embodiment of the present invention.
Figure 22B:
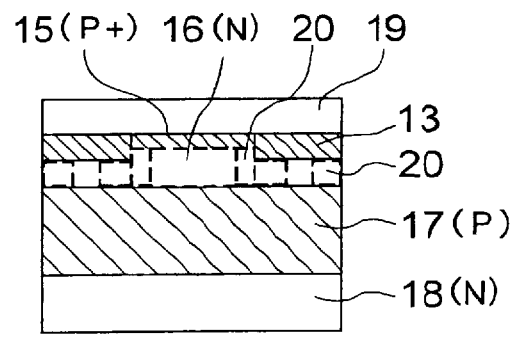

Referring to FIGS. 22A and 22B, a solid state imaging device according to a 21st embodiment of the present invention is obtained by combination of the configurations of the additional implant areas 20 in both the sixth embodiment and the fourteenth embodiment. This configuration of the present embodiment prevents a punch-through phenomenon, increases the stored charge and suppresses the increase of the pulse voltage for the substrate shutter.

Figure 23A:
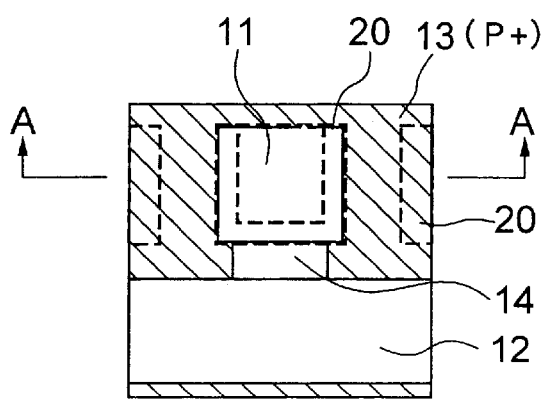
FIGS. 23A and 23B are a top plan view and a sectional view taken along line A—A in FIG. 23A, respectively, of a solid state imaging device according to a 22nd embodiment of the present invention.
Figure 23B:
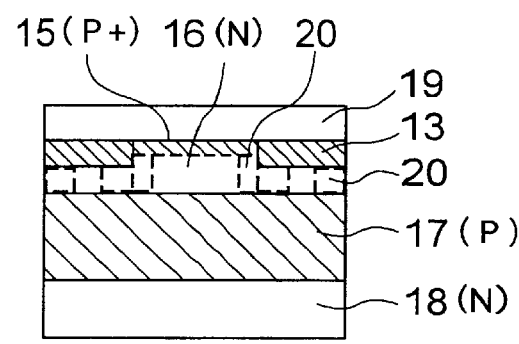

Referring to FIGS. 23A and 23B, a solid state imaging device according to a 22nd embodiment of the present invention is obtained by combination of the configurations of the additional implant area 20 in both the seventh embodiment and the fourteenth embodiment. This configuration of the present embodiment allows the deepest potential portion of the charge storing area to deviate toward the charge transfer channel 14 and thus decrease the gate voltage for read-out, increases the stored charge and suppresses the increase of the pulse voltage for the substrate shutter.

Figure 24A:
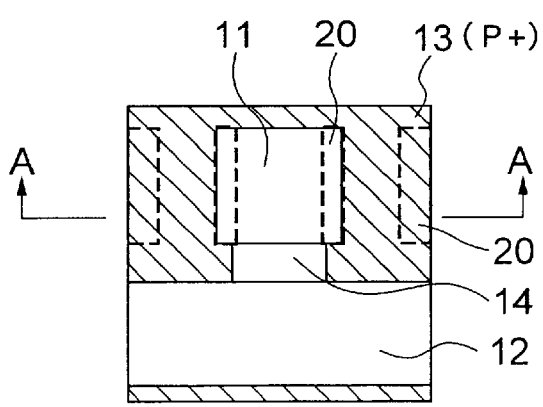
FIGS. 24A and 24B are a top plan view and a sectional view taken along line A—A in FIG. 24A, respectively, of a solid state imaging device according to a 23rd embodiment of the present invention.
Figure 24B:
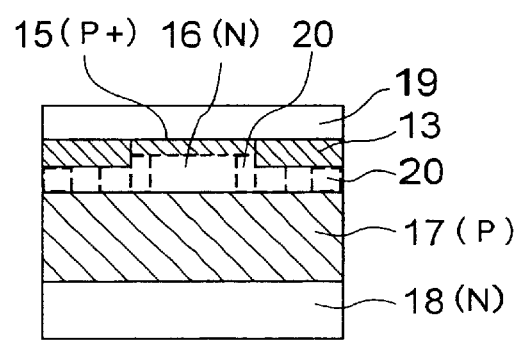

Referring to FIGS. 24A and 24B, a solid state imaging device according to a 23rd embodiment of the present invention is obtained by combination of the configurations of the additional implant area 20 in both the eighth embodiment and the fourteenth embodiment. This configuration of the present embodiment prevents a punch-through phenomenon, increases the stored charge and suppresses the increase of the pulse voltage for the substrate shutter.

Figure 25A:
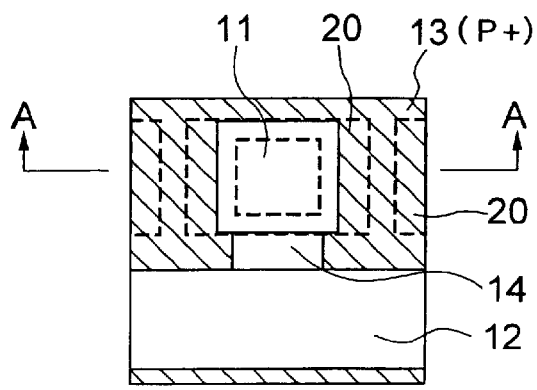
FIGS. 25A and 25B are a top plan view and a sectional view taken along line A—A in FIG. 25A, respectively, of a solid state imaging device according to a 24th embodiment of the present invention.
Figure 25B:
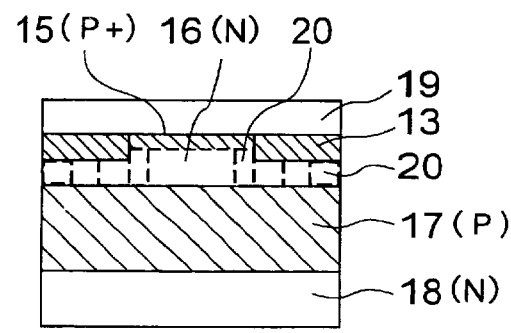

Referring to FIGS. 25A and 25B, a solid state imaging device according to a 24th embodiment of the present invention is obtained by combination of the configurations of the additional implant area 20 in both the ninth embodiment and the fourteenth embodiment. This configuration of the present embodiment prevents a punch-through phenomenon, increases the stored charge and suppresses the increase of the pulse voltage for the substrate shutter.

Figure 26A:
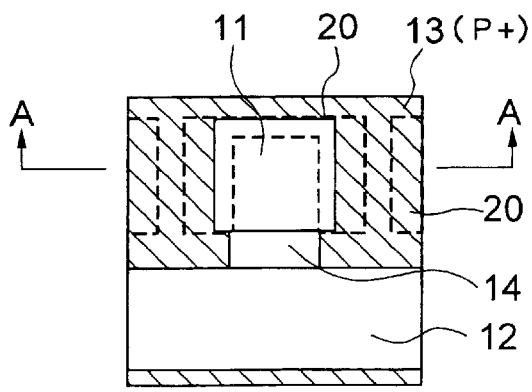
FIGS. 26A and 26B are a top plan view and a sectional view taken along line A—A in FIG. 26A, respectively, of a solid state imaging device according to a 25th embodiment of the present invention.
Figure 26B:
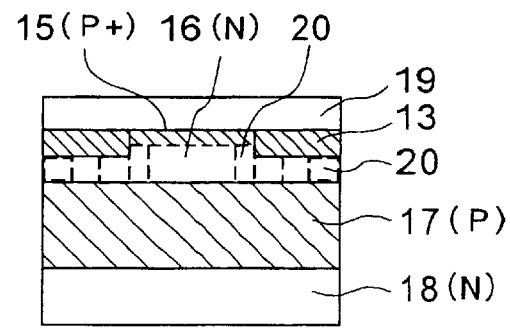

Referring to FIGS. 26A and 26B, a solid state imaging device according to a 25th embodiment of the present invention is obtained by combination of the configurations of the additional implant areas 20 in both the tenth embodiment and the fourteenth embodiment. This configuration prevents a punch-through phenomenon, increases the stored charge and suppresses the increase of the pulse voltage for the substrate shutter.

Figure 27A:
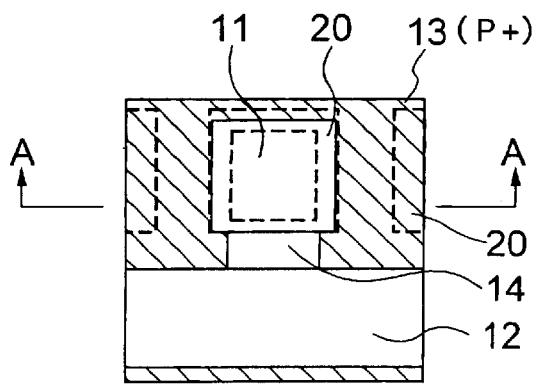
FIGS. 27A and 27B are a top plan view and a sectional view taken along line A—A in FIG. 27A, respectively, of a solid state imaging device according to a 26th embodiment of the present invention.
Figure 27B:
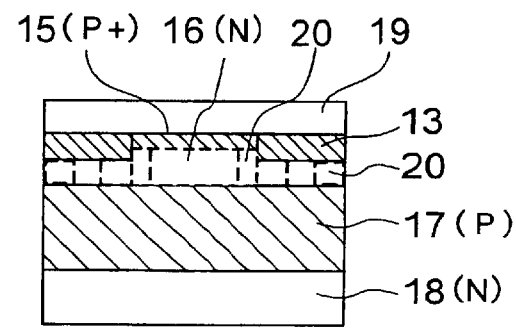

Referring to FIGS. 27A and 27B, a solid state imaging device according to a 26th embodiment of the present invention is obtained by combination of the configurations of the additional implant areas 20 in both the eleventh embodiment and the fourteenth embodiment. This configuration of the present embodiment prevents smear charge from entering the CCD 12 from the photodiode through the isolation region 13, increases the stored charge and suppresses the increase of the pulse voltage for the substrate shutter.

Figure 28A:
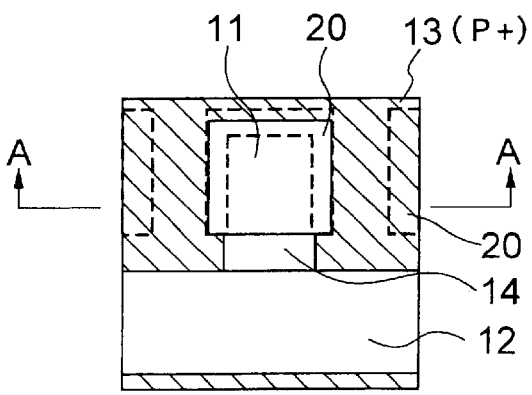
FIGS. 28A and 28B are a top plan view and a sectional view taken along line A—A in FIG. 28A, respectively, of a solid state imaging device according to a 28th embodiment of the present invention.
Figure 28B:
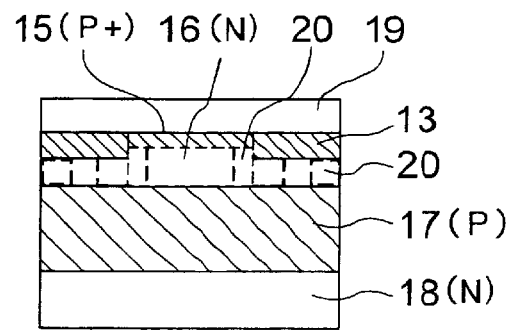

Referring to FIGS. 28A and 28B, a solid state imaging device according to a 27th embodiment of the present invention is obtained by combination of the configurations of the additional implant areas 20 in both the twelfth embodiment and the fourteenth embodiment. This configuration of the present embodiment prevents smear charge from entering the CCD 12 from the photodiode through the isolation region 13, prevents a punch-through phenomenon, increases the stored charge and suppresses the increase of the pulse voltage for the substrate shutter.

Figure 29A:
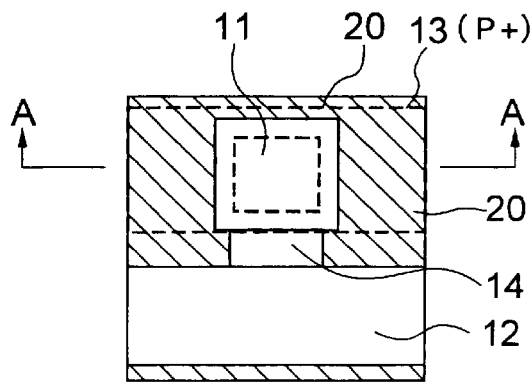
FIGS. 29A and 29B are a top plan view and a sectional view taken along line A—A in FIG. 29A, respectively, of a solid state imaging device according to a 28th embodiment of the present invention.
Figure 29B:
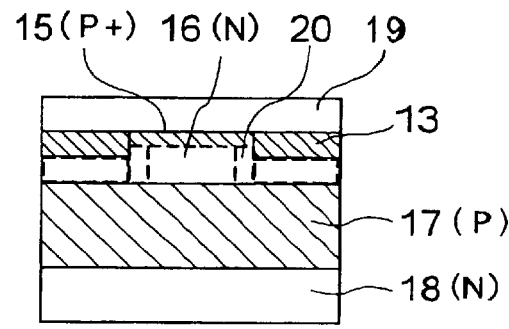

Referring to FIGS. 29A and 29B, a solid state imaging device according to a 28th embodiment, one of tenth aspect of the present invention, is obtained by combination of the configurations of the additional implant areas 20 in both the first embodiment and the fifteenth embodiment. This configuration of the present embodiment increases the stored charge and suppresses the increase of the pulse voltage for the substrate shutter. In addition, it is suited to fine patterning due to a large mask pattern after superposition.

Figure 30A:
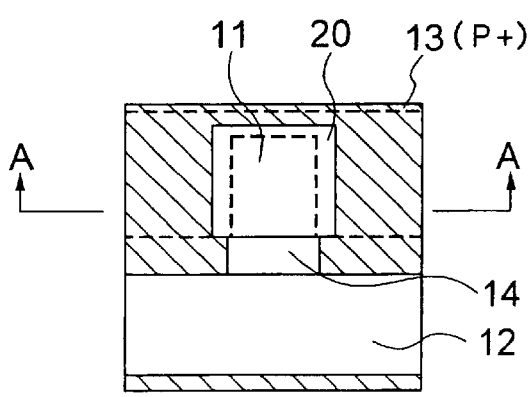
FIGS. 30A and 30B are a top plan view and a sectional view taken along line A—A in FIG. 30A, respectively, of a solid state imaging device according to a 29th embodiment of the present invention.
Figure 30B:
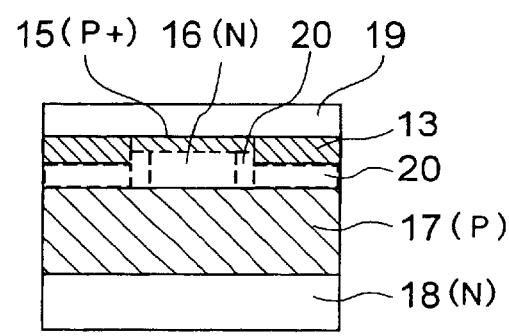

Referring to FIGS. 30A and 30B, a solid state imaging device according to a 29th embodiment of the present invention is obtained by combination of the configurations of the additional implant areas 20 in both the second embodiment and the fifteenth embodiment. This configuration of the present embodiment prevents a punch-through phenomenon, increases the stored charge and suppresses the increase of the pulse voltage for the substrate shutter. In addition, it is suited to finer patterning due to a large mask pattern after superposition.

Referring to FIGS. 31A and 31B, a solid state imaging device according to a 30th embodiment of the present invention is obtained by combination of the configurations of the additional implant areas 20 in both the third embodiment and the fifteenth embodiment. This configuration of the present embodiment allows the deepest potential portion of the charge storing area to deviate toward the charge transfer channel 14 and thus reduce the gate voltage for read-out, increases the stored charge and suppresses the increase of the pulse voltage for the substrate shutter. In addition, it is suited to finer patterning due to a larger mask pattern after superposition.

Referring to FIGS. 32A and 32B, a solid state imaging device according to a 31st embodiment of the present invention is obtained by combination of the configurations of the additional implant areas 20 in both the fourth embodiment and the fifteenth embodiment. This configuration of the present embodiment prevents a punch-through phenomenon, increases the stored charge and suppresses the increase of the pulse voltage for the substrate shutter. In addition, it is suited to finer patterning due to a larger mask pattern after superposition.

Figure 37:
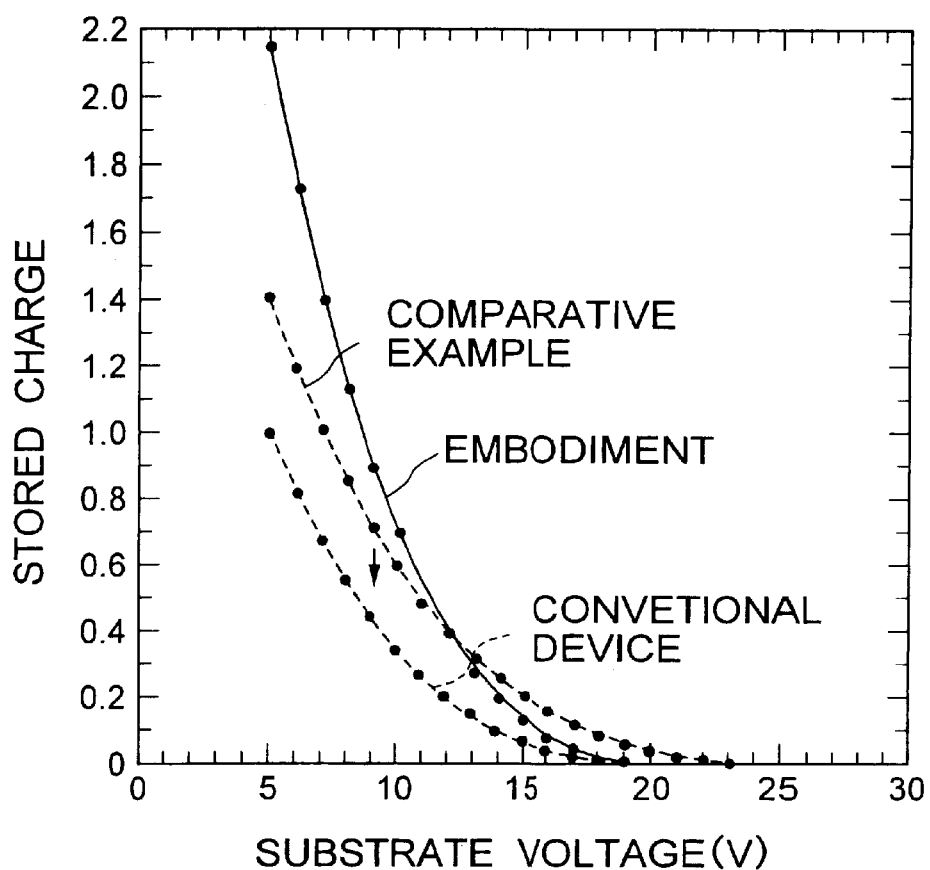
FIG. 37 is a graph showing result of simulation for comparing the 31st embodiment and the conventional device.

FIG. 37 shows, similarly to FIG. 35, results of simulation for the 31st embodiment, a comparative example and the conventional solid state imaging device, wherein conditions for impurity implantation into the additional implant area 20 are similar to those in the N-type layer 16. As understood from the drawing, the maximum stored charge in the present embodiment is increased up to 2.2 times that in the conventional device, whereas the voltage for the substrate to obtain zero electric charge in the photodiode in the present embodiment is equivalent to that in the conventional device. Accordingly, the present embodiment achieves suppression of the increase of the pulse voltage for the substrate shutter compared to the comparative example wherein only the dosage of the N-type layer 16 is raised from the conventional device by 10%. It is to be noted, however, that the conditions for impurity implantation need not be equivalent to those for the N-type layer 16. A higher acceleration energy may decrease the pulse voltage for the substrate shutter and increase the stored charge. It is to be noted, however, that an excessively higher acceleration energy may cause electric charge entering from the substrate to the photodiode.

A higher ion dosage can decrease the pulse voltage for the substrate shutter and increase the stored charge. An excessively higher ion dosage may cause problems that electric charge cannot be read out by a reasonable read-out voltage, electric charge is injected from the substrate, and the isolation region 13 does not function for isolation. The ion acceleration energy and the dosage of the additional implant area 20 may be changed as variable parameters from 50% to 150% and 10% to 300%, respectively, of the acceleration energy and the dosage of the N-type layer 16.

Figure 33A:
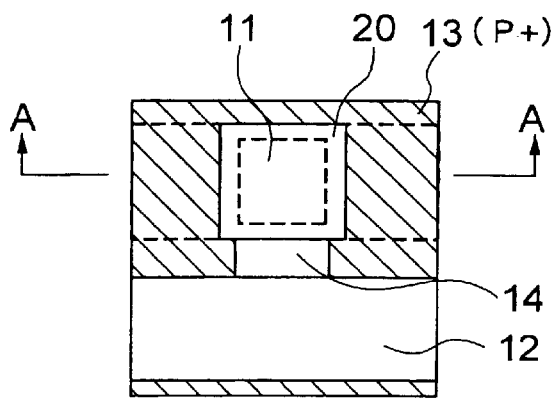
FIGS. 33A and 33B are a top plan view and a sectional view taken along line A—A in FIG. 33A, respectively, of a solid state imaging device according to a 32nd embodiment of the present invention.
Figure 33B:
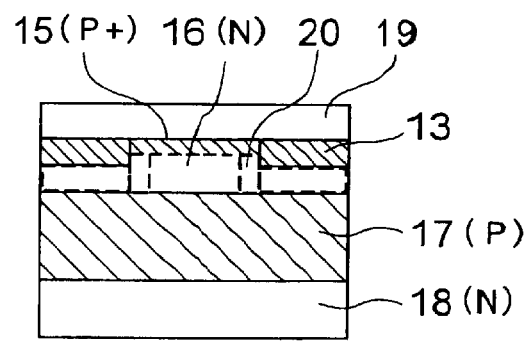

Referring to FIGS. 33A and 33B, a solid state imaging device according to a 32nd embodiment of the present invention is obtained by combination of the configurations of the additional implant areas 20 in both the fifth embodiment and the fifteenth embodiment. This configuration of the present embodiment provides a further increase of the stored charge, and suppresses the increase of the pulse voltage for the substrate shutter. In addition, it is suited to finer patterning due to a larger mask pattern after superposition.

Figure 34A:
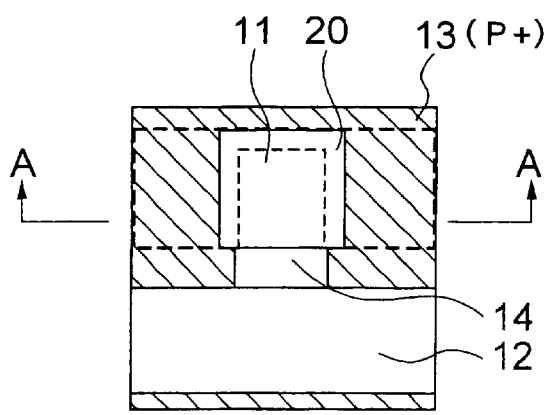
FIGS. 34A and 34B are a top plan view and a sectional view taken along line A—A in FIG. 34A, respectively, of a solid state imaging device according to a 33rd embodiment of the present invention.
Figure 34B:
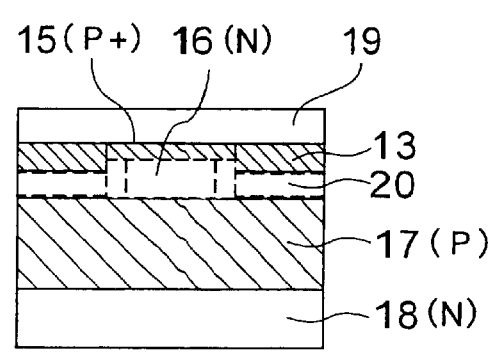

Referring to FIGS. 34A and 34B, a solid state imaging device according to a 33rd embodiment of the present invention is obtained by combination of the configurations of the additional implant areas 20 in both the sixth embodiment and the fifteenth embodiment. This configuration of the present embodiment prevents a punch-through phenomenon wherein the electric charge stored in the photodiode is transferred by overflow through the charge transfer channel 14 to the adjacent CCD 12, increases the stored charge, and suppresses the increase of the pulse voltage for the substrate shutter. In addition, it is suited to finer patterning due to a larger mask pattern after superposition.

Figure 1B:
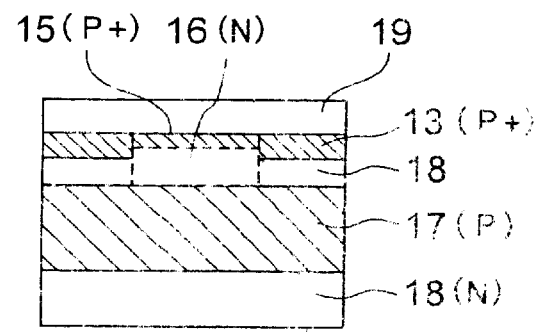

Now, methods for fabricating the solid state imaging devices of the present invention will be described. FIGS. 38A to 43A are sectional views of a solid state imaging device according to the fourth embodiment of the present invention during consecutive steps in fabrication thereof, whereas FIGS. 38B to 43B are top plan views showing the steps corresponding to FIGS. 38A to 43A, respectively. In FIGS. 38A to 43A, details of the N-type substrate 21 including the isolation region 13 and P-type layer 17 are similar to those shown in FIG. 1B and are omitted for illustration in these drawings for a simplification purpose.

Figures 38A, 38B:
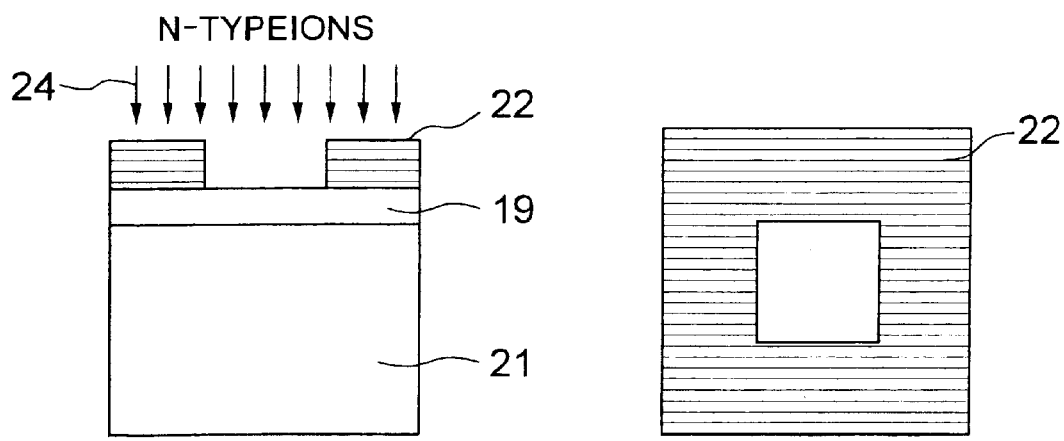
Figure 39A:
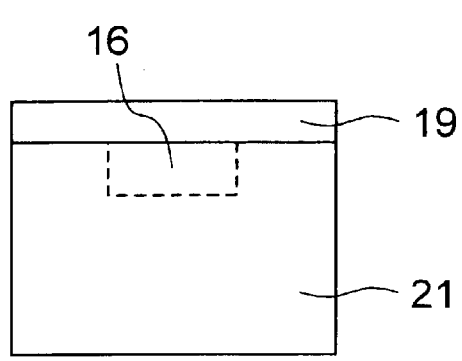
Figure 39B:
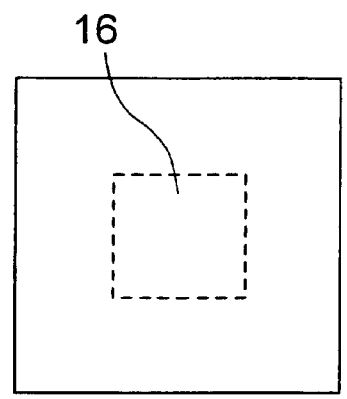

Referring to FIGS. 38A and 38B, it is shown that a photoresist pattern 22 is used as a mask for injecting N-type impurity ions 24 in a photodiode. After the ion implantation, the photoresist pattern 22 is removed, as shown in FIGS. 39A and 39B. An additional ion implantation is then effected as shown in FIGS. 40A and 40B, wherein another mask pattern 22A made of photoresist is used as a mask to form a pair of stripe additional implant areas 20 by implanting N-type impurity ions 25.

Figure 41A:
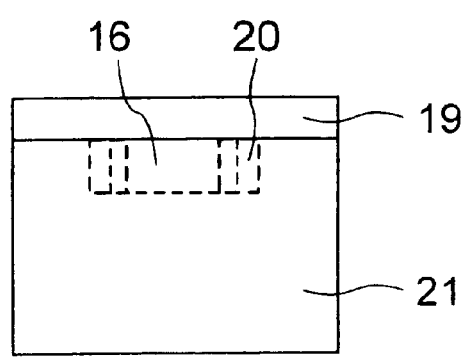
Figure 41B:
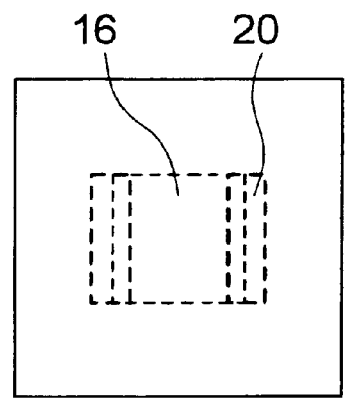
Figure 42A:
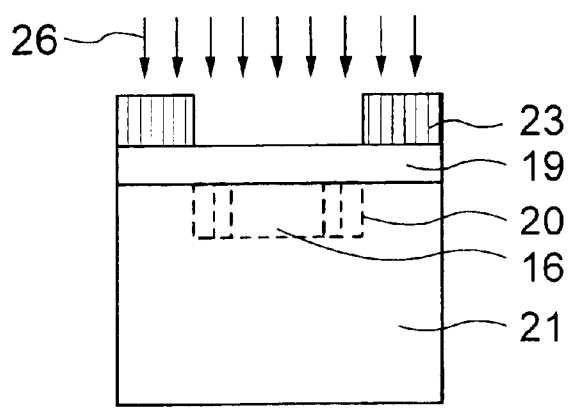
Figure 42B:
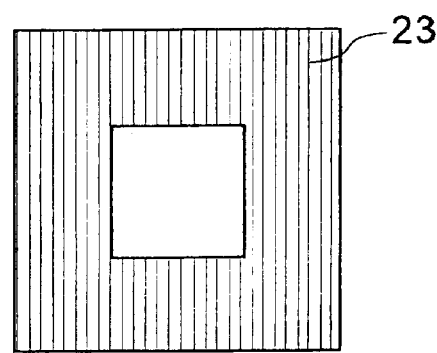
Figure 43A:
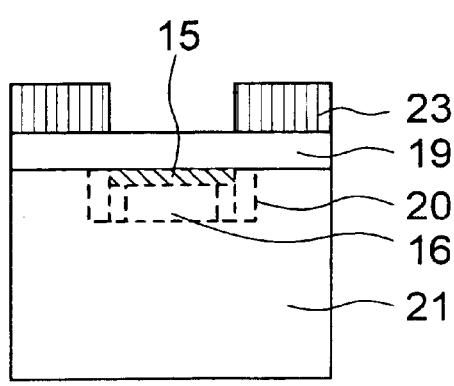
Figure 43B:
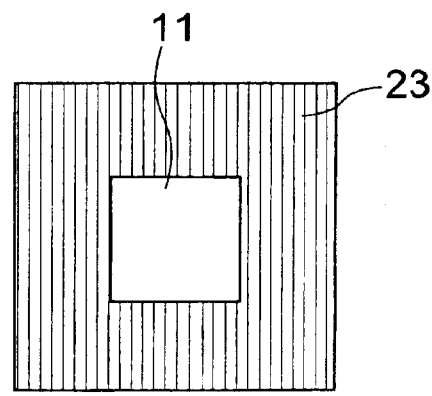

After the another mask pattern 22A is removed as shown in FIGS. 41A and 41B, the additional implant areas 20 are provided at both sides of the N-type layer 16 of the photodiode. Thereafter, a conductive film pattern 23 implementing an electrode is formed thereon having an opening for exposing the charge storing area and used as a mask for implantation of P-type impurity ions 26 to form the P$^+$-type layer 15 of the photodiode on the N-type layer 16 between the additional implant areas 20, as shown in FIGS. 43A and 43B.

Figure 40A:
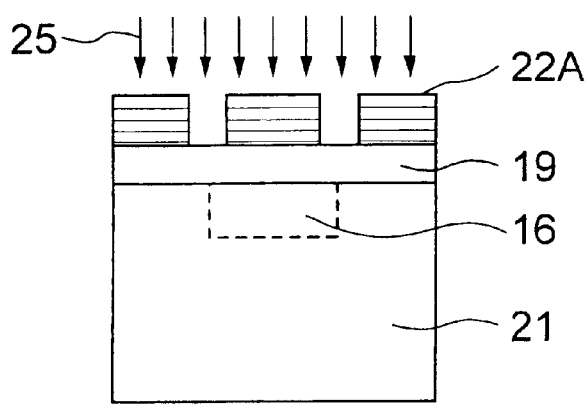
Figure 40B:
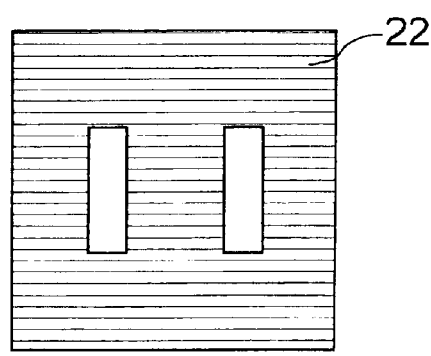

Other solid state imaging device of the above-described embodiments can be formed by modifying the another mask pattern 22A shown in FIGS. 40A and 40B. The order of the steps shown in FIGS. 38A, 38B, 39A and 39B may be reversed with the steps shown in FIGS. 40A, 40B, 41A and 41B.

FIGS. 44A to 49A are sectional views of a solid state imaging device according to the fourth embodiment of the present invention during consecutive steps thereof, whereas FIGS. 44B to 49B are top plan views showing the steps corresponding to FIGS. 44A to 49A, respectively. In FIGS. 44A to 49A, details of the N-type substrate 21 including the isolation region 13 and P-type layer 17 are similar to those shown in FIG. 1B and are omitted for illustration in these drawings for a simplification purpose.

Figure 44A:
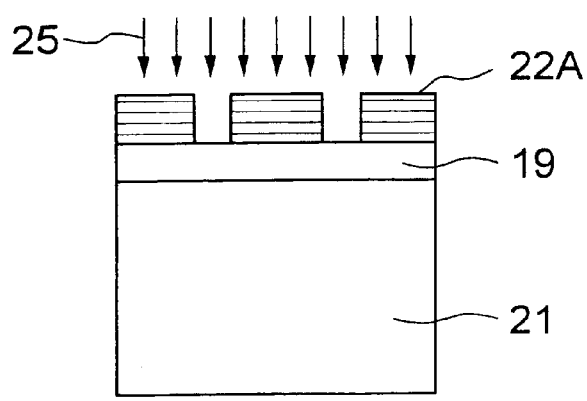
Figure 44B:
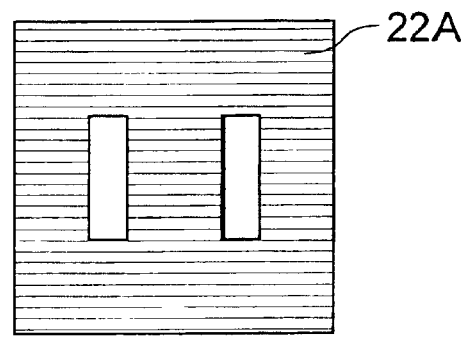
Figure 45A:
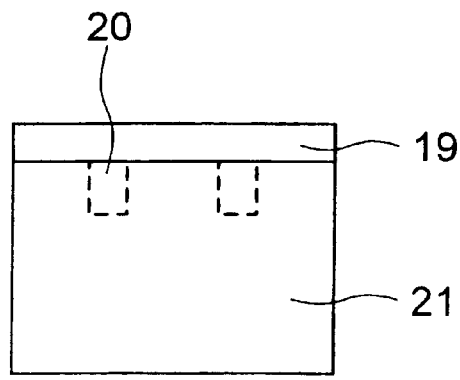
Figure 45B:
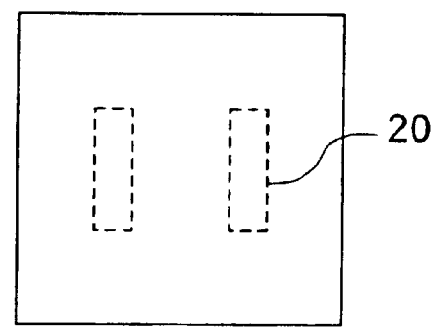
Figure 46A:
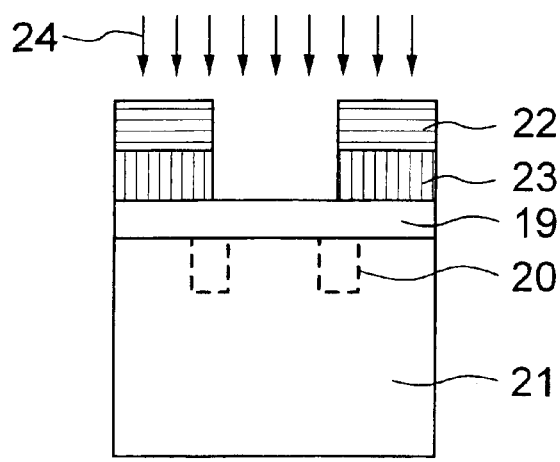
Figure 46B:
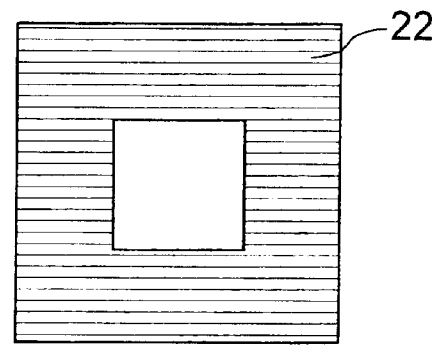
Figure 47A:
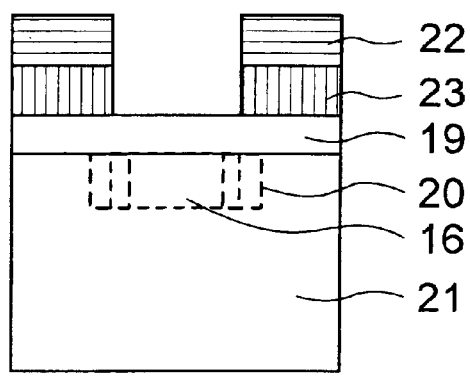
Figure 47B:
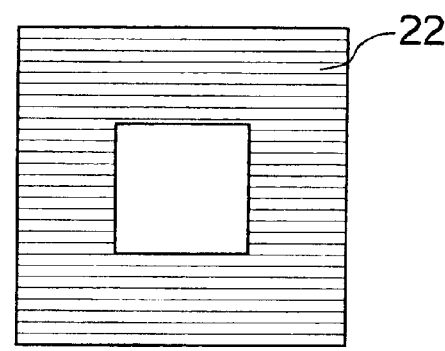
Figure 48A:
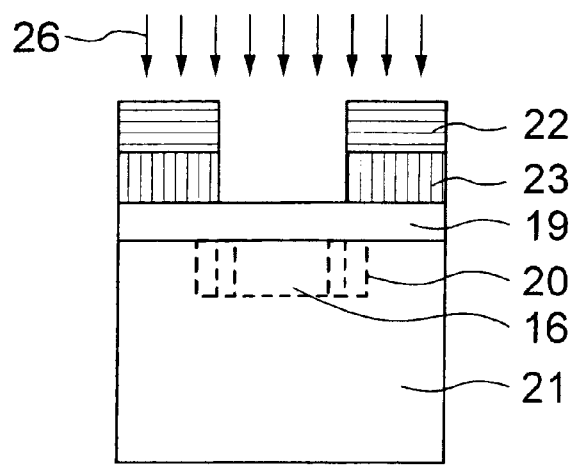
Figure 48B:
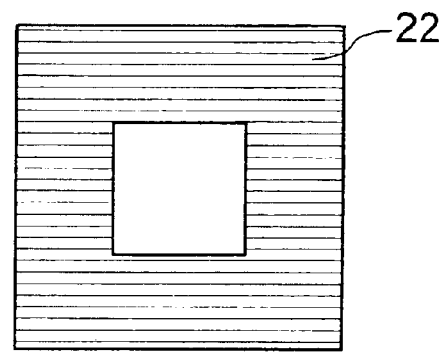
Figure 49A:
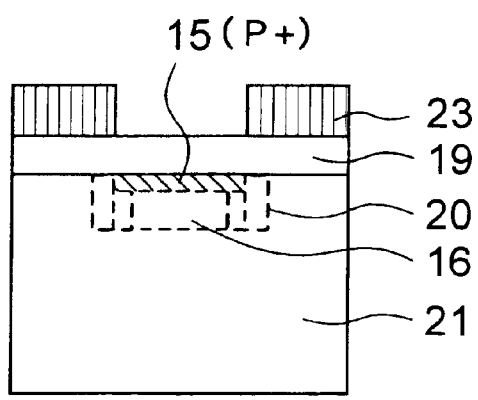
Figure 49B:
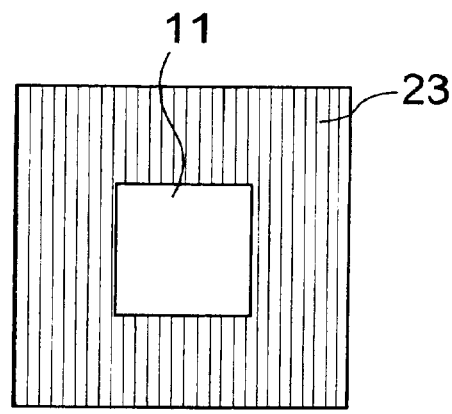

In FIGS. 44A and 44B, after steps similar to those in FIGS. 38A, 38B, 39A and 39B, a photoresist film 22A is patterned and used as a mask for implantation of N-type impurity ions 25 to form additional implant areas. The photoresist film 22A is removed, as shown in FIGS. 45A and 46B, to leave the additional implant areas 20. Then, as shown in FIGS. 46A and 46B, a conductive film 23 is deposited, followed by application and patterning of a photoresist film 22. The photoresist film 22 is used as a mask for patterning of the conductive film 23, followed by implantation of N-type impurity ions 24 by using the photoresist film 22 as a mask to form the N-type layer 16 of the photodiode, as shown in FIGS. 47A and 47B. In an alternative, the photoresist film may be replaced by another photoresist film. The photoresist film 22 or the another photoresist film is then used for implantation of P-type impurity ions 26 to form the P-type layer 15 of the photodiode, as shown in FIGS. 48A and 48B. In a modification, the conductive film 23 alone may be used as the mask for implantation. After the photoresist film is removed, the solid state imaging device of the fourth embodiment is obtained as shown in FIGS. 49A and 49B.

FIGS. 50A to 55A are sectional views of a solid state imaging device according to the fifth embodiment of the present invention during consecutive steps of fabrication thereof, whereas FIGS. 50B to 55B are top plan views showing the steps corresponding to FIGS. 50A to 55A, respectively. In FIGS. 50A to 55A, details of the N-type substrate 21 including the isolation region 13 and the P-type layer 17 is similar to those shown in FIG. 1B and are omitted for illustration in these drawings for a simplification purpose.

Figure 50A:
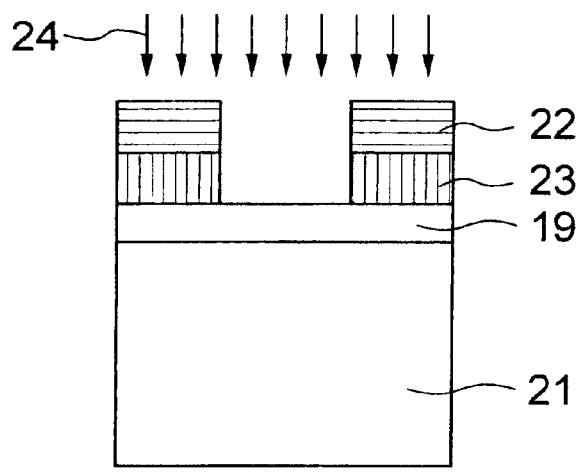
Figure 50B:
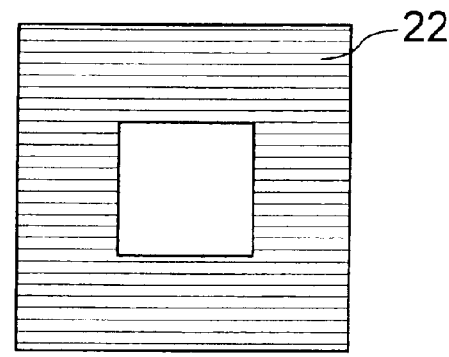
Figure 51A:
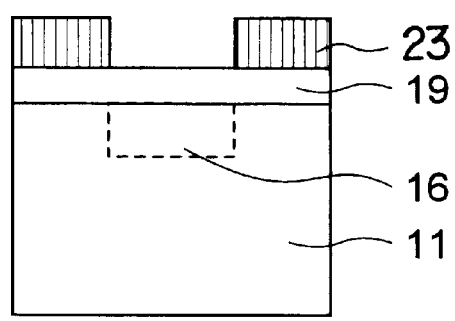
Figure 51B:
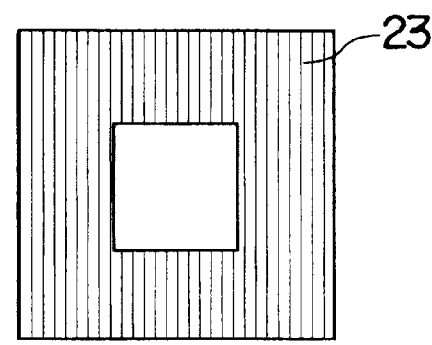
Figure 52A:
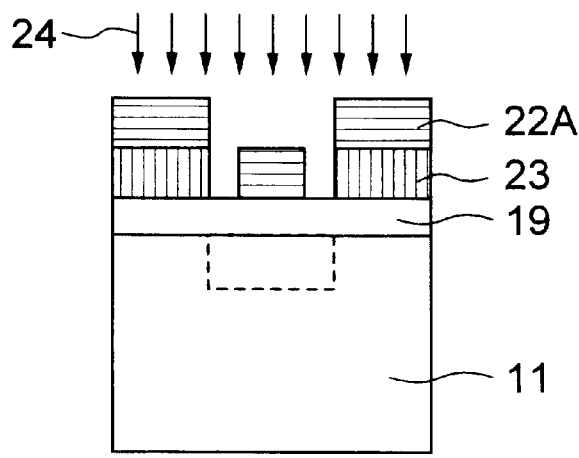
Figure 52B:
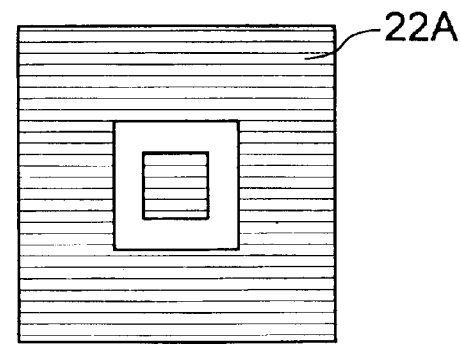
Figure 53A:
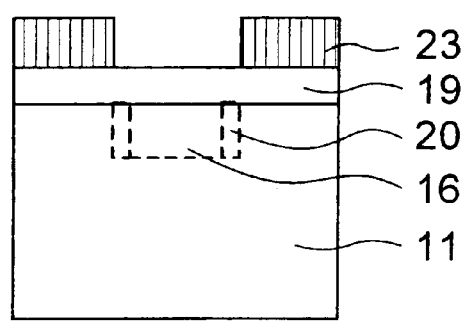
Figure 53B:
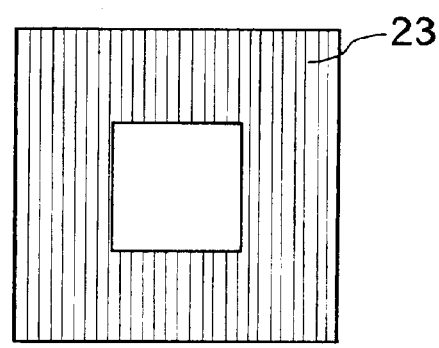
Figure 54A:
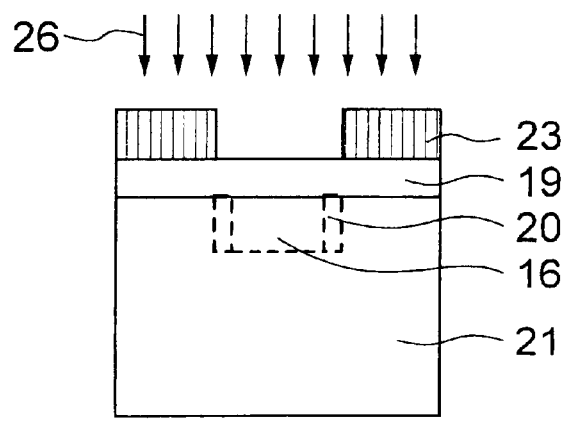
Figure 54B:
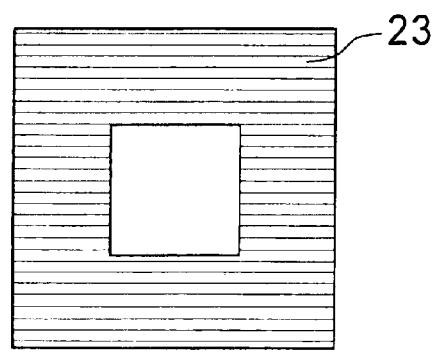
Figure 55A:
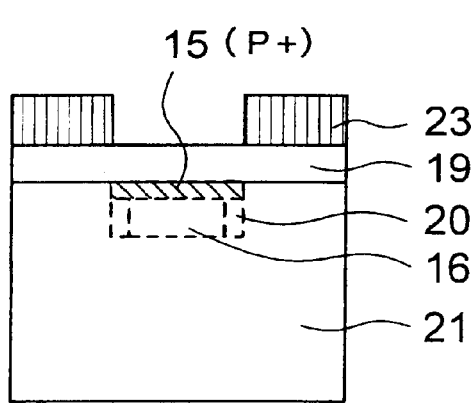
Figure 55B:
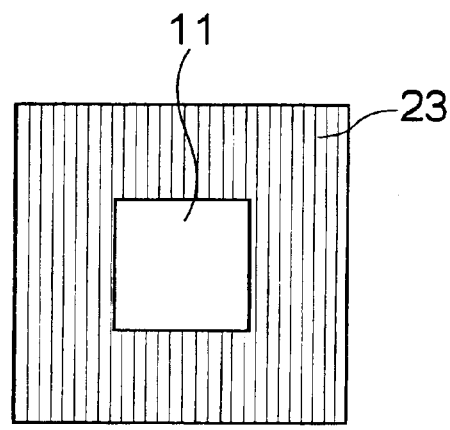

In FIGS. 50A and 50B, it is shown that a photoresist pattern 22 is used as a mask for patterning a conductive film 23 implementing an electrode and used also as a mask for implanting N-type impurity ions 24 for forming an N-type layer 16 of the photodiode. As an alternative, separate mask patterns may be used for patterning the conductive film 23 and for implantation of impurity ions 24. After the ion implantation, the photoresist pattern 22 is removed as shown in FIGS. 51A and 51B to leave the N-type layer 16. Then, another mask pattern 22A having an opening for exposing the periphery of the N-type layer 16 is formed on the conductive film 23, followed by additional implantation of impurity ions 24, as shown in FIGS. 52A and 52B, to form the additional implant area 20 in the periphery of the N-type layer 16, as shown in FIGS. 53A and 53B. After the another mask pattern 22A is removed, P-type impurity ions 26 are then implanted into the surface region of the N-type layer 16 by using the conductive film 23 as a mask, as shown in FIGS. 54A and 54B, thereby obtaining the structure of the fifth embodiment as shown in FIGS. 55A and 55B. The solid state imaging devices of the other embodiments, such as sixth to eighth embodiments, may be formed by modifying the mask pattern 22A shown in FIGS. 52A and 52B.

In a modification of the fabrication processes, additional implant area may be formed by ion implantation using a plurality of mask patterns and associated implantation using different acceleration energies or different dosages.

In a modification of the solid state imaging devices as described above, the conductivity types may be reversed.

A solid state imaging device according to a 34th embodiment of the present invention includes a photodiode having a junction between the charge storing area and the isolation region, at least a portion of the junction having a heavily doped region (or additional implant area) which has a higher dosage than the other area of the charge storing area. The width of the heavily doped region is smaller than the minimum size defined by the current design rule.

Referring to FIGS. 56A to 56D, there is shown the solid state imaging device of the present embodiment during consecutive steps in fabrication thereof. First, a thermal oxide film 113 having a thickness of 200 to 600 angstroms is formed on an N-type silicon substrate 101 having a phosphorous concentration on the order of $10^{14}/cm^3$, followed by ion implantation of boron with an acceleration energy of 0.5 to 3 MeV, a dosage of 0.5 to $5 \times 10^{11}/cm^2$. After a thermal treatment at between 900 and 980° C. for between a half hour and two hours, a P-type layer 102 is formed in the N-type silicon substrate 101.

Thereafter, a photoresist film 121 is formed on the pixel region by using a photolithographic technique, followed by ion implantation of boron with an acceleration energy at between 20 and 40 keV and a dosage of 1 to $5 \times 10^{13}/cm^2$ to form a P$^+$-type channel stopper 105. Then, the photoresist film 121 is removed and another photoresist film 122 is formed having an opening for exposing the charge storing area. Then, phosphorous ions are implanted using the photoresist film 122 as a mask, with an acceleration energy of 200 to 500 keV and a dosage of 1.1 to $20 \times 10^{12}/cm^2$, to form an N$^+$-type region 112 in the charge storing area. The dosage used herein is 1.1 to 4 times that used in the N-type layer in the conventional device. The multiplication factor here is equal to the ratio of the final impurity concentration of the N$^+$-type region 112 to the impurity concentration of the N-type layer 103 of the photodiode. By this configuration, after a later boron implantation, the central area has an impurity concentration equivalent to the impurity concentration of the N-type region in the conventional device.

Figure 56A:
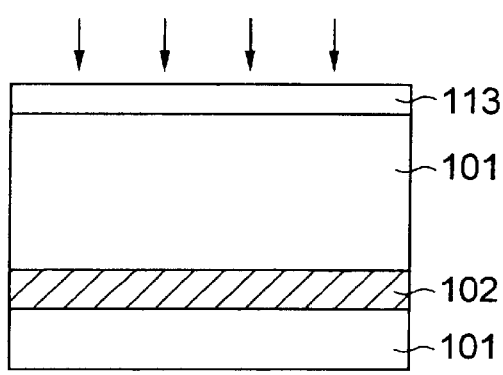
FIGS. 56A to 56D are sectional views showing consecutive steps in a process for fabricating a solid state imaging device according to 34th embodiment of the present invention.
Figure 56D:
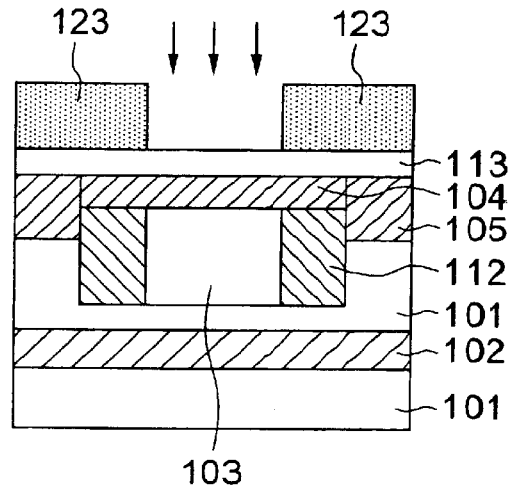
Figure 56B:
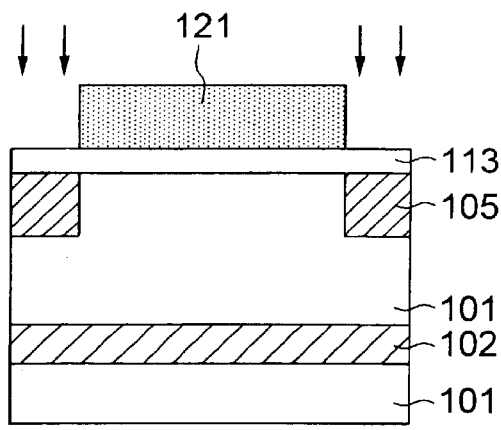
Figure 56C:
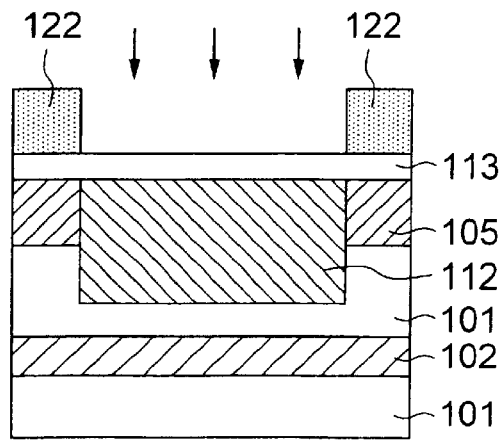

Then, by using the same photoresist film 122, boron ions are implanted with an acceleration energy of 20 to 60 keV and a dosage on the order of $10^{12}/cm^2$ to form a shallow P$^+$-layer 104 on the surface region of the substrate. The photoresist film 122 may be replaced by another photoresist film instead. Then, the photoresist film 122 is removed and another photoresist film 123 is formed, as shown in FIG. 56D, followed by boron implantation using the photoresist film 123 as a mask with an acceleration energy of 50 to 500 keV and a dosage of 0.1 to $15 \times 10^{12}/cm^2$ to form an N-type layer 103. This dosage is determined so that the impurity concentration of the N-type dopant for the N-type region 112 minus the impurity concentration of the P-type dopant is equivalent to the impurity concentration of the N-type layer of the photodiode in the conventional device. In addition, the acceleration energy is determined so that the peaks in the depth profiles for the phosphorous and boron are equivalent to each other. Thereafter, the photoresist film 123 is removed, followed by activation of the dopant by a thermal treatment at 900 to 980° C. for half to one hour in a nitrogen ambient, the dopant being obtained by the previous ion implantation. Next, the thermal oxide film 113 is removed by a wet etching using hydrofluoric acid, followed by a wet oxidation to form a gate insulation film having a thickness of 500 to 1000 angstroms. A doped polycrystalline silicon (polysilicon) film is then formed thereon and patterned by using a photolithographic and dry etching technique to form transfer electrodes not shown. An interlayer insulation film is then formed and a shield film having an opening for exposing the photoelectric conversion area is formed thereon to achieve pixel elements of the solid state imaging device of the present embodiment.

The final width of the N$^+$-type region 112 is determined by the position of the openings in the photoresist film 122 used for implantation of the phosphorous and the photoresist film 123 used for implantation of the boron. This provides a finer pattern for the N$^+$-type region 112 compared to the design rule of the current solid state imaging device and the minimum alignment accuracy of the exposure system used therein. In addition, the implanted boron is diffused by a thermal diffusion process to further reduce the width of the N$^+$-type region 112 and to increase the stored charge.

Figure 57A:
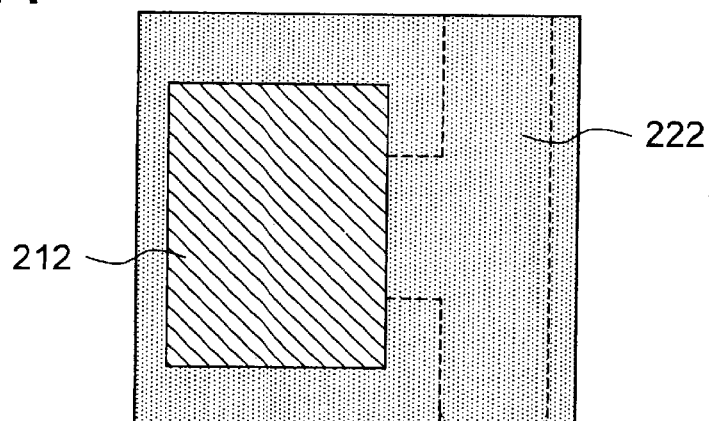
FIGS. 57A to 57C are sectional views showing consecutive steps in a process for fabricating a solid state imaging device according to 35th embodiment of the present invention.
Figure 57B:
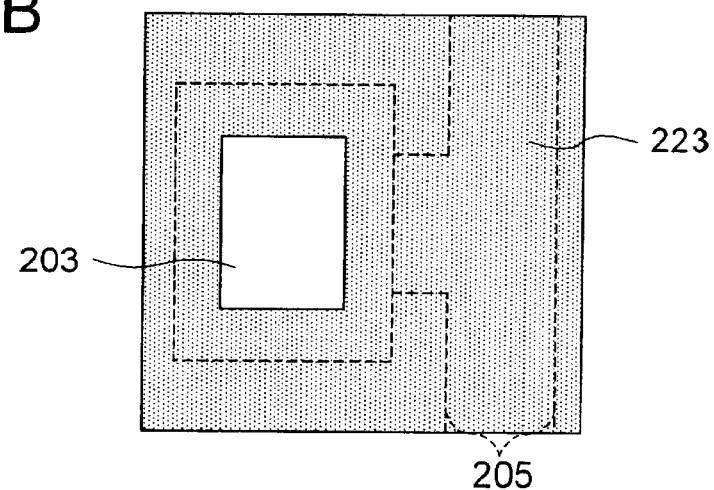
Figure 57C:
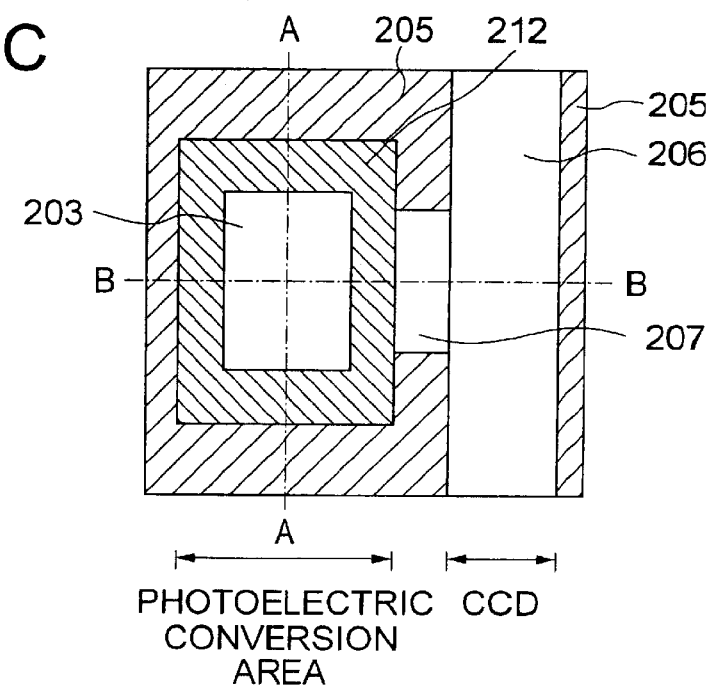

Referring to FIGS. 57A to 57C showing consecutive steps in fabrication of a solid state imaging device according to a 35th embodiment of the present invention, the N$^+$-type region 212 has four sides. Specifically, the solid state imaging device is subjected to steps similar to the steps shown in FIGS. 56A and 56B in the 34th embodiment, followed by the step of FIG. 57A, wherein a photoresist film 222 is formed having an opening for exposing a photoelectric conversion area (charge storing area) and used as a mask for implantation of phosphorous ions to form an N$^+$-type region 212 in the charge storing area. Then, the same photoresist film 222 is used for implanting boron ions to form a shallow P$^+$-type layer (not shown) in the surface region of the substrate. Thereafter, the photoresist film 222 is removed and another photoresist film 223 is formed having a smaller opening, followed by implantation of boron ions by using the another photoresist film 223 to form an N-type region 203 in the central region of the charge storing area. In this implantation, the acceleration energy and the dosage thereof are similar to those in the 34th embodiment. After steps similar to the steps described for the first embodiment, the solid state imaging device shown in FIG. 57C is obtained. In FIGS. 57C, the transfer gate and the shield film are omitted for illustration.

According to the present embodiment, the N+-type region 212 is formed for surrounding the photoelectric conversion area 203. Accordingly, the width of the depletion layer extending from the P$^+$-type region can be reduced in both the directions which are parallel and normal to the direction of the CCD 206, thereby increasing the stored charge.

In a modification of the 35th embodiment, the side of the N$^+$-type region 212 adjacent to the charge transfer channel 207 may be replaced by a portion of the N-type charge storing area 203. Since the charge storing area 203 does not contact with the P$^+$-type channel stopper 205 in the side of the charge storing area 203 adjacent to the charge transfer channel 207, this side of the N-type region 203 is more likely to be subjected to a dip due to a higher potential compared to other regions in contact with the P$^+$-type channel stopper 205. Thus, the modification achieves prevention of generation of the dip due to the absence of the portion of the N$^+$-type region 212 in the side of the charge storing area 203 near the charge transfer channel 207.

Figure 58A:
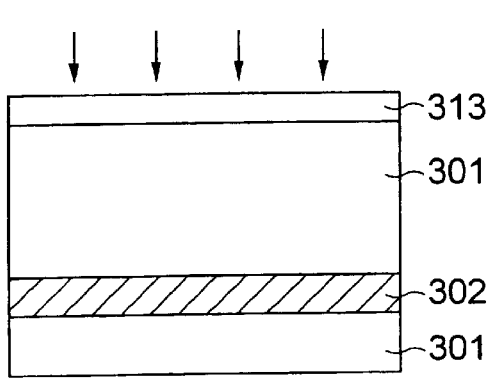
FIGS. 58A to 58E are sectional views showing consecutive steps in a process for fabricating a solid state imaging device according to 36th embodiment of the present invention.
Figure 58D:
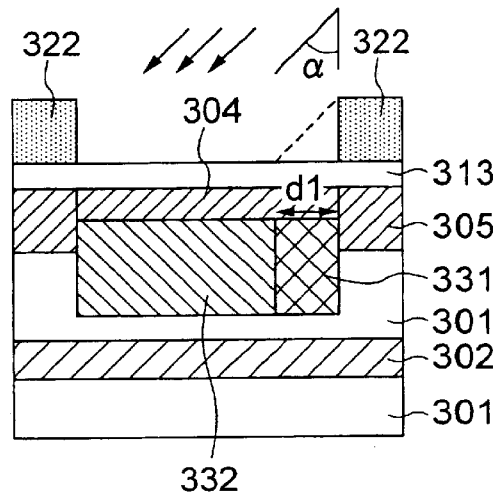
Figure 58B:
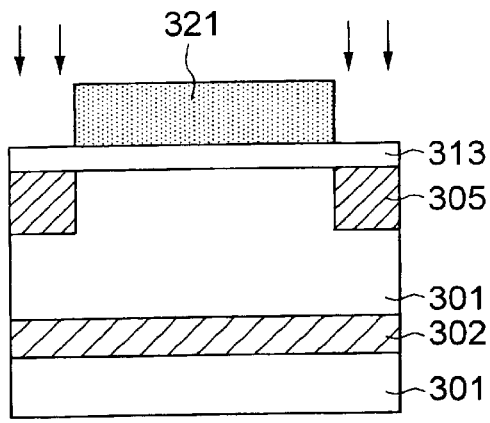
Figure 58E:
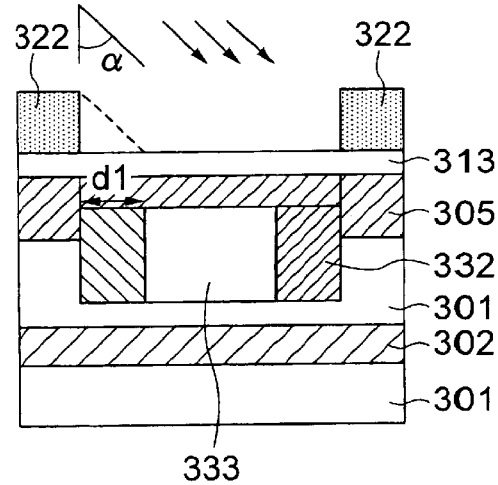
Figure 58C:
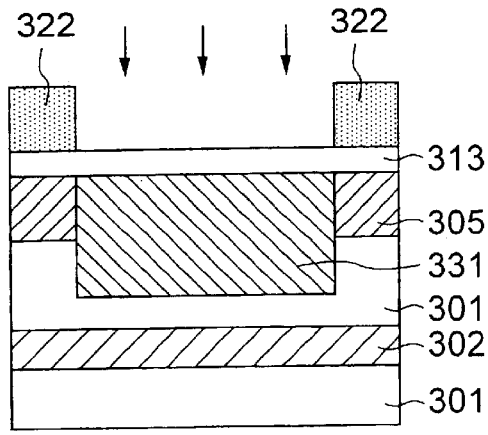

FIGS. 58A to 58E show consecutive steps in fabrication of a solid state imaging device according to 36th embodiment of the present invention. Similarly to the 34th embodiment, a P-type layer 302 is formed in an N-type substrate 301, as shown in FIG. 58A, followed by implantation of boron ions by using a photoresist film 321 as a mask to form a channel stopper 305, as shown in FIG. 58B. Subsequently, a photoresist film 322 is formed and used as a mask for implantation of phosphorous ions with an acceleration energy of 200 to 500 keV and a dosage of 1.2 to $35 \times 10^{12}/cm^2$ to form an $N^{++}$-type region 331. The dosage is about 0.2 to 7 times that for the N-type layer of the photodiode. This multiplication factor is represented by (2a−1) provided that "a" is the ratio of the final impurity concentration of the $N^+$-type region 322 to the impurity concentration of the N-type layer 333 implementing the charge storing area. This dosage is also determined so that the impurity concentration of the central region of the photoelectric conversion area after two steps of later boron implantation is equivalent to the impurity concentration of the N-type layer of the photodiode in the conventional device.

Then, as shown in FIG. 58D, the same photoresist film 322 is used for a first skew implantation of boron ions with an acceleration energy of 50 to 500 keV and a dosage of 0.1 to $15 \times 10^{12}/cm^2$ to form an $N^+$-type region 332 from the $N^{++}$-type region by diluting the impurity concentration thereof. The skew angle is represented by α as viewed from the normal line in the drawing and may be between 3 and 20 degrees. The dosage in this step is determined so that the impurity concentration of the $N^+$-type region 332 after the first boron implantation is equivalent to the impurity concentration of an ordinary $N^+$-type region. The acceleration energy in this step is determined so that the peaks in the depth profile for phosphorous and boron are equivalent to each other. In this step, boron ions are not introduced into the area shielded by the photoresist film 322 to leave the $N^{++}$-type region 331, which extends from the edge of the opening of the photoresist film 322 toward the central area by d1. The distance d1 is represented by the following formula:

$$d1 = L \times \tan\alpha$$

wherein L is the sum of the thicknesses of the photoresist film 322 and the thermal oxide film 313. Thus, the distance d1 can be controlled by the thickness L and the angle α.

Thereafter, the same photoresist film 322 is used for a second skew implantation of boron ions, the direction of the skew being opposite to the direction of the skew in the first skew implantation. Thus, an N-type region 333 is formed from the $N^+$-type region 332 by dilution of the impurity concentration therein, and an $N^+$-type region 322 is formed from the remaining $N^{++}$-type region 331. In this step, boron ions are not introduced into the area shielded by the photoresist film 322 to leave the $N^+$-type region 332 as a portion of the $N^+$-type region 322, which extends from the edge of the opening of the photoresist film 322 toward the central area of the photoelectric conversion area 333 by d1. Thus, the central area implemented as an N-type region is sandwiched between $N^+$-regions 332.

After the second skew implantation, the impurity concentration of the N-type region 333 is equivalent to the impurity concentration of the N-type layer of the photodiode in the conventional device. By using the photoresist film 322 for the plurality of implantation steps shown FIGS. 58C, 58D and 58E, a misalignment can be avoided between the $N^+$-type region 332 and the N-type layer 333. Subsequently, the same photoresist film 322 is used for implantation of boron ions with an acceleration energy of 20 to 60 keV and a dosage on the order of $10^{12}/cm^2$ to form a shallow $P^+$-type layer 304 in the surface region of the substrate. Another photoresist film other than the photoresist film 322 used for the skew implantation may be used in this step.

Thereafter, steps similar to the steps in the 34th embodiment are conducted to achieve a solid state imaging device of the present invention. In the present embodiment, the width of the $N^+$-type region 332 can be made smaller than the minimum size determined by the current design rule, by controlling the thickness L, the angle α of the skew implantation and the subsequent diffusion step using the thermal treatment, substantially without misalignment of a mask pattern in the exposure system between the N-type region 333 and the $N^+$-type region 332.

In a modification of the 36th embodiment, a single skew implantation step may be conducted. In addition, the direction of the skew in the implantation may be arbitrarily selected and may be skewed from the sides of the photoelectric conversion area.

Figure 59A:
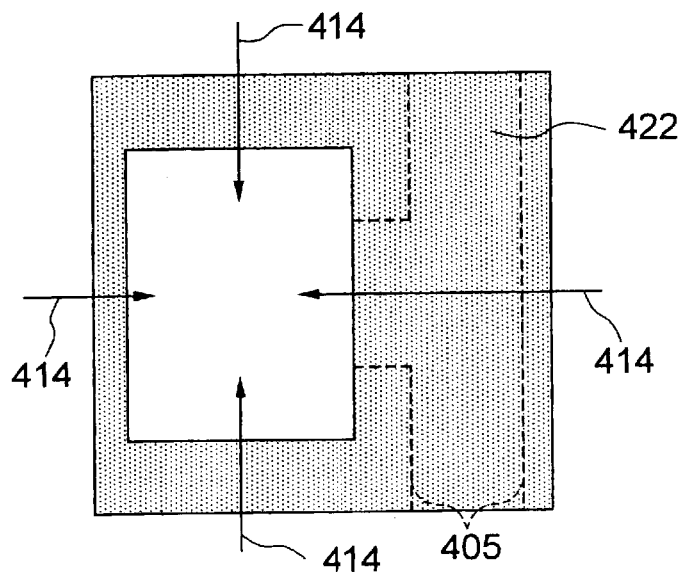
FIGS. 59A and 59B are top plan views showing consecutive steps in a process for fabricating a solid state imaging device according to 37th embodiment of the present invention.
Figure 59B:
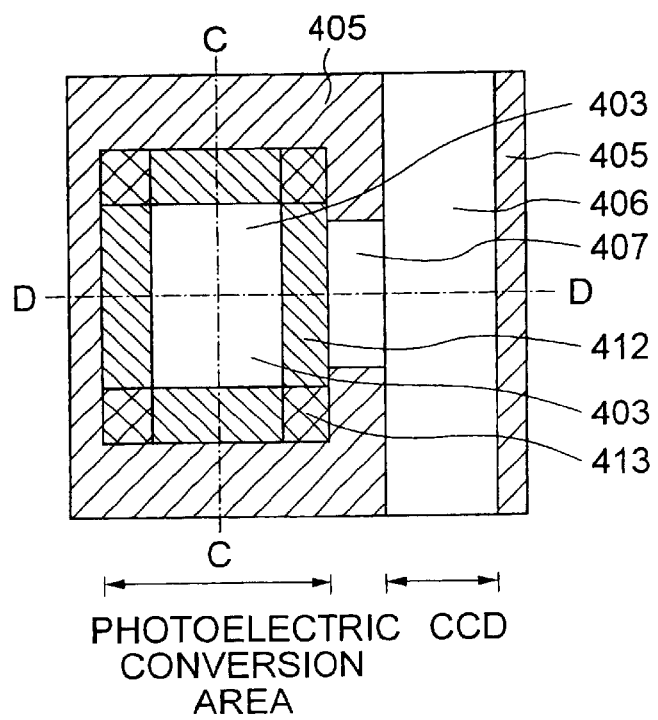

Referring to FIGS. 59A and 59B showing consecutive steps in fabrication of a solid state imaging device according to a 37th embodiment of the present invention, skew ion implantation is effected in four directions. Specifically, after steps similar to the steps shown in FIGS. 58A to 58C, including ion implantation of phosphorous by using a photoresist film 422 as a mask, are conducted to the 37th embodiment, the same photoresist film 422 is used for first through fourth skew implantation of boron ions, wherein boron ions are introduced in four directions, as shown in FIG. 60A. Thus, $N^+$-type regions 412 are formed on four sides of the N-type charge storing area 403, and $N^{++}$-type regions 413 are formed adjacent to the four corners of the N-type charge storing area 402. This provides advantages in reduction of the width of the depletion layer extending from the $P^+$-type region in the directions C—C and D—D of the drawing, which are normal and parallel, respectively, to the direction of the CCD 406.

The $N^{++}$-type regions 413 formed at the four corners of the photoelectric conversion area 403 has a larger impurity concentration compared to the $N^+$-type regions 412 due to a less number of implantation steps. At this corners of the photoelectric conversion area 403, a high potential gradient can be provided from the channel stopper 405, thereby further increasing the stored charge. The increase of the stored charge is more remarkable in the case of the smaller area for the photoelectric conversion area. The directions of the skew for the implantation need not be normal or parallel to the sides of the photoelectric conversion area.

In the 34th to 37th embodiments, the present invention is applied to the photoelectric conversion area having a longitudinal overflow drain structure, wherein the charge storing area is provided on the P-type layer formed on the N-type substrate. However, it will be understood that the present invention can be applied to another type of photoelectric conversion area wherein $P^+$-type layer is formed on an N-type layer formed on a P-type substrate.

In addition, the present invention can be applied to a longitudinal overflow drain structure, wherein a photoelectric conversion area is formed in a P-well formed on an N-type substrate. Further, the present invention can be applied to a photoelectric conversion area wherein a $P^+$-type region is not formed on an N-type substrate. The N-type impurity ions may be arsenic ions or other N-type impurity ions instead of phosphorous ions. The charge may be positive holes instead of electrons, with the N-type and the P-type reversed from the embodiments as well as the directions of the applied voltages.

The CCD type solid state image sensor may be replaced another type of image sensor having MOSFETs and signal lines. The photoelectric conversion area may be formed as a single photodetector, wherein the signal charge can be read out below the charge transfer channel as in the embodiments or may be read out from the back surface of the substrate.

Since the above embodiments are described only for examples, the present invention is not limited to the above embodiments and various modifications or alterations can be easily made therefrom by those skilled in the art without departing from the scope of the present invention.

What is claimed is:

1. A solid state imaging device comprising:
   a semiconductor substrate having a first conductivity type,
   a first layer having a second conductivity type opposite to said first conductivity type,
   a charge storing layer formed on a top of said first layer and having said first conductivity,
   a second layer formed on a top of said charge storing layer and having said second conductivity type, said charge storing layer and said second layer forming a junction of a photodiode,
   a charge transfer channel formed adjacent to said charge storing layer,
   an isolation region having said second conductivity, sides of said charge storing layer being in contact with said isolation region except for a side adjacent to said charge transfer channel, and
   an additional implant area comprising impurity ions, the implant area being arranged to overlap said charge storing layer so that the impurity ions are present in the charge storing layer only along a perimeter of the charge storing layer.

2. The solid state imaging device as defined in claim 1, wherein said additional implant area additionally overlaps said isolation region.

3. The solid state imaging device as defined in claim 1, wherein said additional implant area surrounds said charge storing layer except for a side adjacent to said charge transfer channel.

4. The solid state imaging device as defined in claim 1, wherein said additional implant area surrounds said charge storing layer except for a side opposing to said charge transfer channel.

5. The solid state imaging device as defined in claim 1, wherein said additional implant area does not extend through a junction between said charge storing layer and said isolation region.

6. The solid state imaging device as defined in claim 1, wherein said additional implant area extends through at least a portion of junction between said charge storing layer and said isolation region toward said isolation region.

7. A solid state imaging device comprising:
   a semiconductor substrate having a first conductivity type,
   a first layer having a second conductivity type opposite to said first conductivity type,
   a charge storing layer formed on a top of said first layer and having said first conductivity,
   a second layer formed on a top of said charge storing layer and having said second conductivity type, said charge storing layer and said second layer forming a junction of a photodiode,
   a charge transfer channel formed adjacent to said charge storing layer,
   an isolation region having said second conductivity, sides of said charge storing layer being in contact with said isolation region except for a side adjacent to said charge transfer channel, and
   a first additional implant area comprising impurity ions having said first conductivity type and disposed in said isolation region.

8. The solid state imaging device as defined in claim 7, wherein said additional implant area is disposed outside a central area of said isolation region disposed between two adjacent charge storing layer.

9. The solid state imaging device as defined in claim 7, wherein said additional implant area does not extend through a junction between said charge storing layer and said isolation region.

10. The solid state imaging device as defined in claim 7, further comprising a second additional implant area comprising impurity ions having said first conductivity type, the second additional implant area being arranged to overlap said charge storing layer so that the impurity ions of the second additional implant area are present in the charge storing layer only along a perimeter of the charge storing layer.

* * * * *